United States Patent

Inui

(10) Patent No.: US 11,076,117 B2
(45) Date of Patent: Jul. 27, 2021

(54) SOLID-STATE IMAGING DEVICE AND METHOD OF DRIVING SOLID-STATE IMAGING DEVICE

(71) Applicant: CANON KABUSHIKI KAISHA, Tokyo (JP)

(72) Inventor: Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/459,354

(22) Filed: Jul. 1, 2019

(65) Prior Publication Data
US 2020/0029044 A1    Jan. 23, 2020

(30) Foreign Application Priority Data

Jul. 18, 2018 (JP) .............................. JP2018-135004

(51) Int. Cl.
| | |
|---|---|
| H04N 5/00 | (2011.01) |
| H04N 5/378 | (2011.01) |
| H03K 17/687 | (2006.01) |
| H04N 5/355 | (2011.01) |
| G01J 1/44 | (2006.01) |
| G06T 7/55 | (2017.01) |
| H03F 3/04 | (2006.01) |

(52) U.S. Cl.
CPC ................ H04N 5/378 (2013.01); G01J 1/44 (2013.01); G06T 7/55 (2017.01); H03F 3/04 (2013.01); H03K 17/687 (2013.01); H04N 5/355 (2013.01)

(58) Field of Classification Search
CPC .. H03F 3/08; H03F 3/04; H04N 5/378; H04N 5/374; H04N 5/355; H04N 5/35518; H03K 17/687; G06T 7/55; G01J 1/44
See application file for complete search history.

(56) References Cited

U.S. PATENT DOCUMENTS

| | | | |
|---|---|---|---|
| 6,950,136 | B1 | 9/2005 | Hagihara |
| 7,227,208 | B2 | 6/2007 | Ogura |
| 7,561,199 | B2 | 7/2009 | Noda |
| 7,719,587 | B2 | 5/2010 | Ogura |

(Continued)

FOREIGN PATENT DOCUMENTS

| | | |
|---|---|---|
| JP | 2000-196961 | 7/2000 |
| JP | 2001-94877 | 4/2001 |

(Continued)

*Primary Examiner* — Zhihan Zhou
(74) *Attorney, Agent, or Firm* — Venable LLP

(57) ABSTRACT

A method of driving a solid-state imaging device includes: setting voltage of an input node of an amplifier unit to a first voltage by using logarithmic compression to convert current generated by charges overflowing from a photoelectric conversion unit to the input node into voltage corresponding to the current, transferring charges from the photoelectric conversion unit to the input node, setting voltage of the input node to a second voltage by converting the charges into voltage corresponding to the charges, at the amplifier unit, outputting a first signal based on the first voltage and a second signal based on the second voltage, performing the logarithmic compression by using a diode connected to the input node, and acquiring, as a reference signal, an output of the amplifier unit when the input node is set to a third voltage defined in accordance with a threshold voltage of the diode.

24 Claims, 16 Drawing Sheets

(56) References Cited

U.S. PATENT DOCUMENTS

| | | | |
|---|---|---|---|
| 8,259,205 B2 | 9/2012 | Noda | |
| 8,952,433 B2 | 2/2015 | Inui | |
| 9,538,112 B2 | 1/2017 | Wada | |
| 10,347,679 B2 | 7/2019 | Kato | |
| 2004/0233313 A1* | 11/2004 | Ando | H04N 3/155 348/308 |
| 2005/0280056 A1 | 12/2005 | Hagihara | |
| 2007/0131991 A1* | 6/2007 | Sugawa | H01L 27/14603 257/292 |
| 2008/0258045 A1* | 10/2008 | Oike | H04N 5/3559 250/208.1 |
| 2008/0277700 A1* | 11/2008 | Kawahito | H01L 27/14609 257/292 |
| 2010/0224765 A1* | 9/2010 | Seitz | H04N 5/35518 250/214.1 |
| 2010/0230579 A1* | 9/2010 | Watanabe | H01L 27/14609 250/208.1 |
| 2012/0119272 A1* | 5/2012 | Inui | H01L 27/14612 257/292 |
| 2015/0062367 A1 | 3/2015 | Inui | |
| 2015/0281621 A1* | 10/2015 | Ni | H04N 5/3592 250/208.1 |
| 2018/0026073 A1 | 1/2018 | Tsuboi | |
| 2020/0021755 A1* | 1/2020 | Toyofuku | H01L 27/146 |

FOREIGN PATENT DOCUMENTS

| | | |
|---|---|---|
| JP | 2007-104069 | 4/2007 |
| WO | 2005/083790 | 9/2005 |

* cited by examiner

TIME t1

TIME t3

TIME t5

TIME t8 ~ TIME t9

TIME t12 ~ TIME t13

TIME t13 ~ TIME t14

TIME t14 ~ TIME t15

SOLID-STATE IMAGING DEVICE AND METHOD OF DRIVING SOLID-STATE IMAGING DEVICE

BACKGROUND OF THE INVENTION

Field of the Invention

The present invention relates to a solid-state imaging device and a method of driving the solid-state imaging device.

Description of the Related Art

In recent years, imaging systems with a CMOS image sensor suitable for low power consumption or high rate readout (a digital still camera, a camcorder, or the like) have been widely used. For CMOS image sensors, more improved properties are desired, one of which is an increased dynamic range. International Publication No. WO2005/083790 discloses a technology of achieving a wide dynamic range by increasing the amount of charges that can be handled in a pixel unit.

To acquire a higher quality image, however, further increase of a dynamic range of an output signal is desired.

SUMMARY OF THE INVENTION

The object of the present invention is to provide a solid-state imaging device and a method of driving the same that can increase a dynamic range of an output signal.

According to one aspect of the present invention, provided is a solid-state imaging device including a photoelectric conversion unit that generates charges by photoelectric conversion, a transfer unit connected to the photoelectric conversion unit, an amplifier unit having an input node connected to the transfer unit, a logarithmic compression conversion unit connected to the input node, and a charge-to-voltage conversion unit connected to the input node, wherein when a current generated by charges overflowing from the photoelectric conversion unit to the input node with the transfer unit being not conductive is converted into a voltage corresponding to the current by logarithmic compression performed by the logarithmic compression conversion unit, a voltage of the input node is a first voltage, wherein when charges transferred from the photoelectric conversion unit to the input node in response to conduction of the transfer unit are converted into a voltage corresponding to the charges by the charge-to-voltage conversion unit, a voltage of the input node is a second voltage, wherein the amplifier unit outputs a first signal based on the first voltage and a second signal based on the second voltage, wherein the logarithmic compression conversion unit includes a diode connected to the input node, and wherein the first voltage is a voltage corresponding to a voltage of the input node that changes due to the current flowing to the diode whose operational point is set in a sub-threshold region.

Further, according to another aspect of the present invention, provided is a method of driving a solid-state imaging device including a photoelectric conversion unit that generates charges by photoelectric conversion and an amplifier unit that has an input node, the method including setting a voltage of the input node to a first voltage by using logarithmic compression to convert a current generated by charges overflowing from the photoelectric conversion unit to the input node into a voltage corresponding to the current, transferring charges from the photoelectric conversion unit to the input node, setting a voltage of the input node to a second voltage by converting the charges transferred to the input node into a corresponding voltage, at the amplifier unit, outputting a first signal based on the first voltage and a second signal based on the second voltage, performing the logarithmic compression by using a diode connected to the input node, and acquiring, as a reference signal for the first signal, an output of the amplifier unit when the input node is set to a third voltage defined in accordance with a threshold voltage of the diode.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A solid-state imaging device and a method of driving the same according to a first embodiment of the present invention will be described with reference to FIG. 1 to FIG. 7G.

Figure 1:
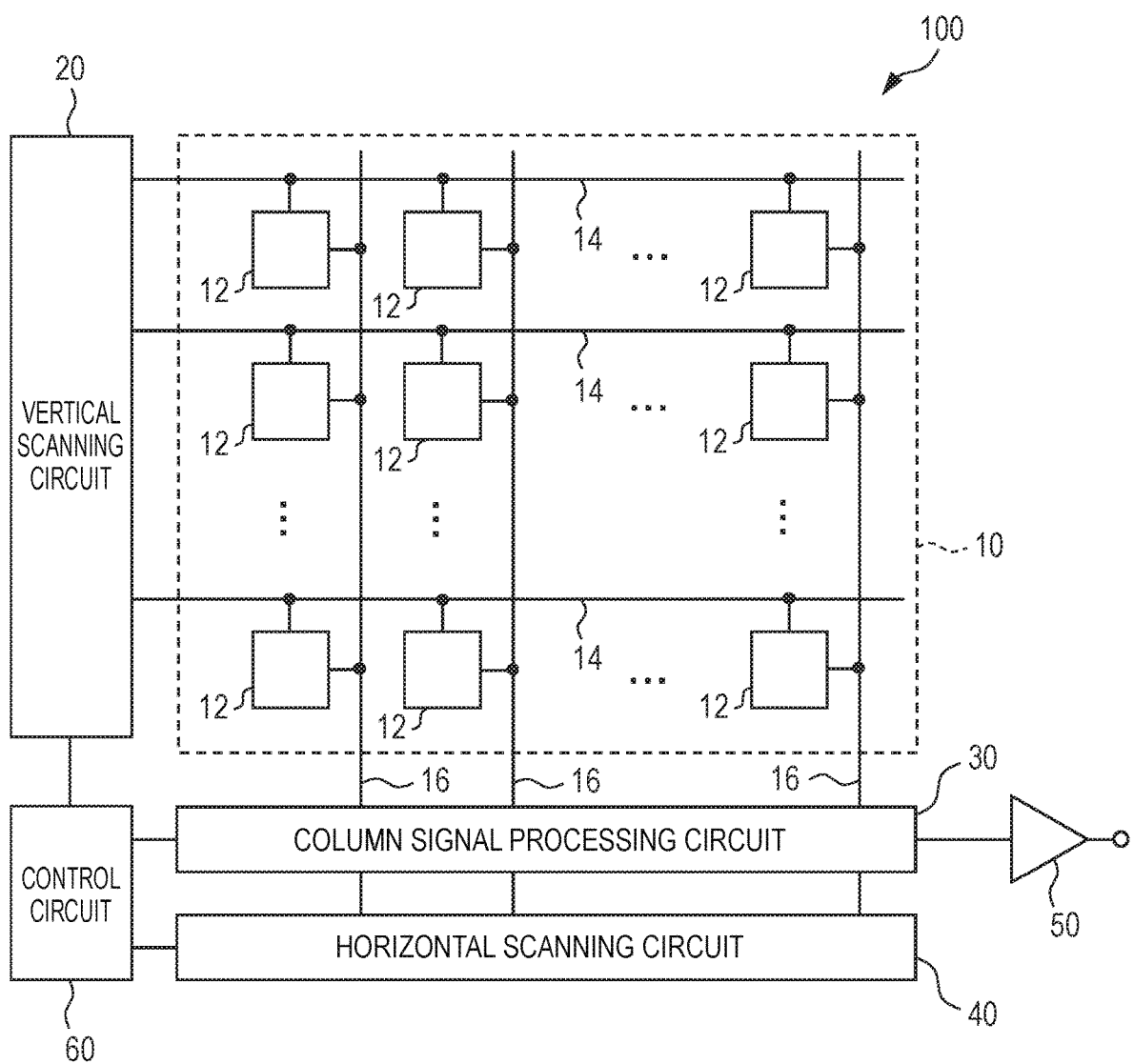
FIG. 1 is a block diagram illustrating a general configuration of a solid-state imaging device according to a first embodiment of the present invention.
Figure 2:
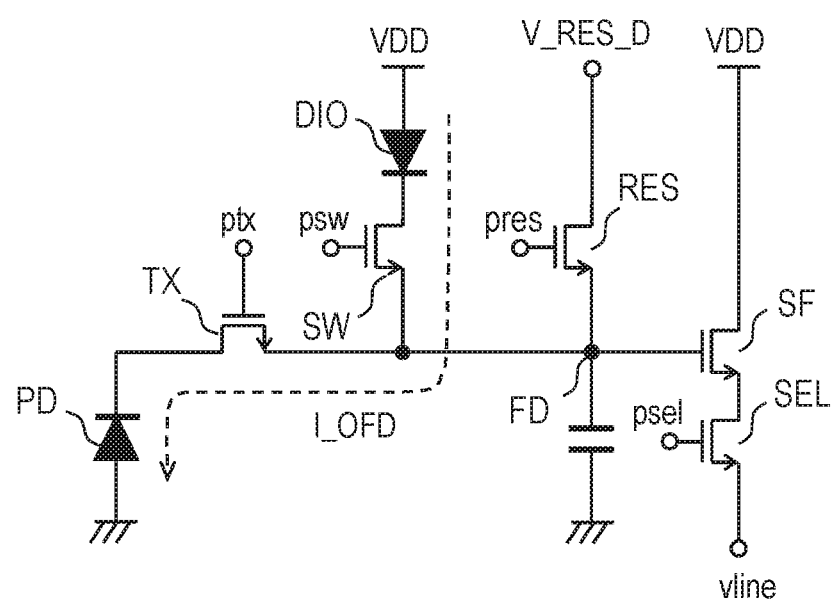
FIG. 2 is a circuit diagram illustrating a configuration example of a pixel of the solid-state imaging device according to the first embodiment of the present invention.
Figure 3:
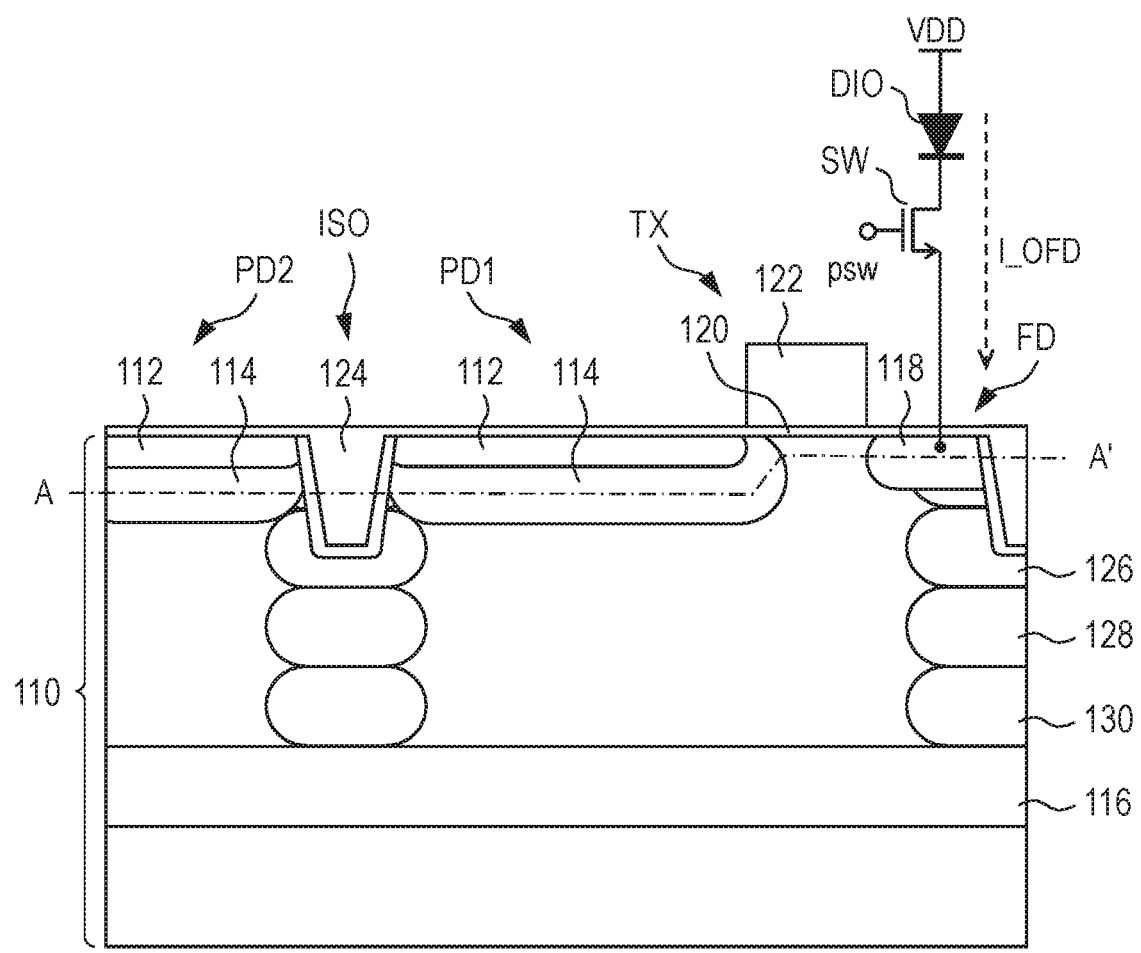
FIG. 3 is a schematic cross-sectional view illustrating the structure of a pixel of the solid-state imaging device according to the first embodiment of the present invention.
Figure 4:
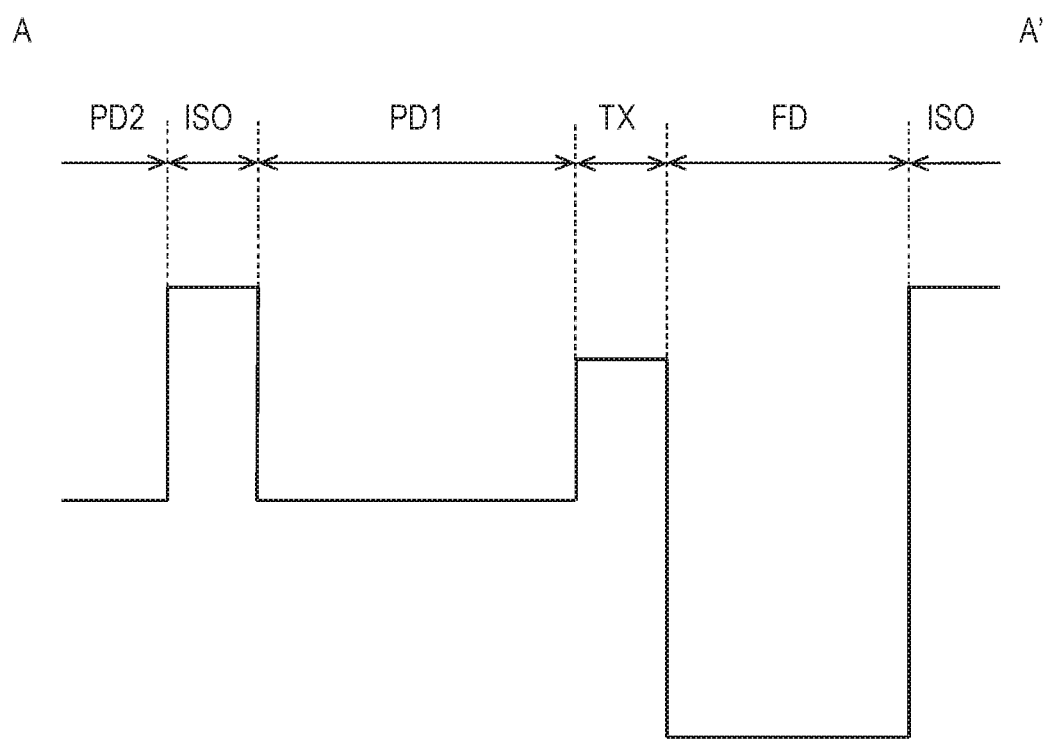
FIG. 4 is a diagram illustrating a potential distribution of a pixel of the solid-state imaging device according to the first embodiment of the present invention.
Figure 5A:
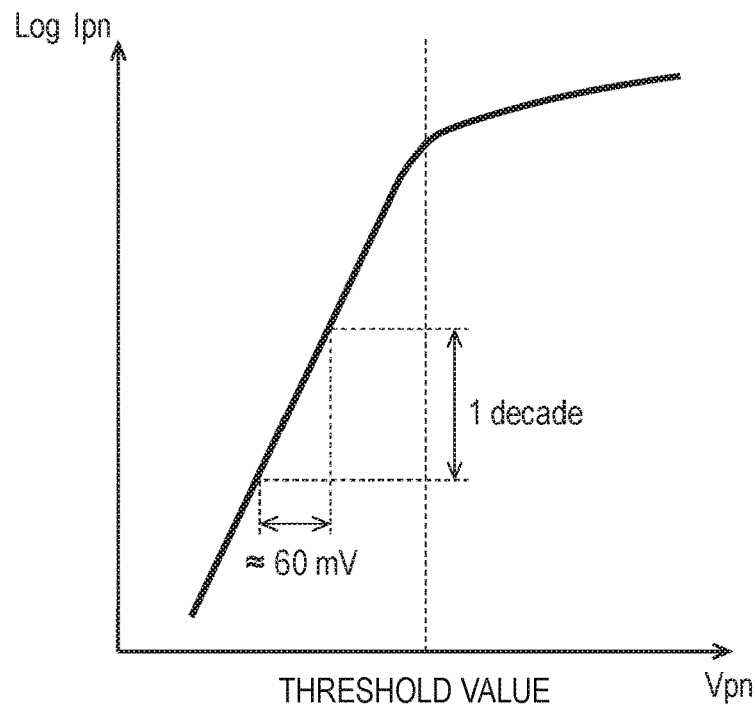
FIG. 5A and FIG. 5B are graphs illustrating I-V characteristics in a sub-threshold region of a diode and a MOS transistor.
Figure 5B:
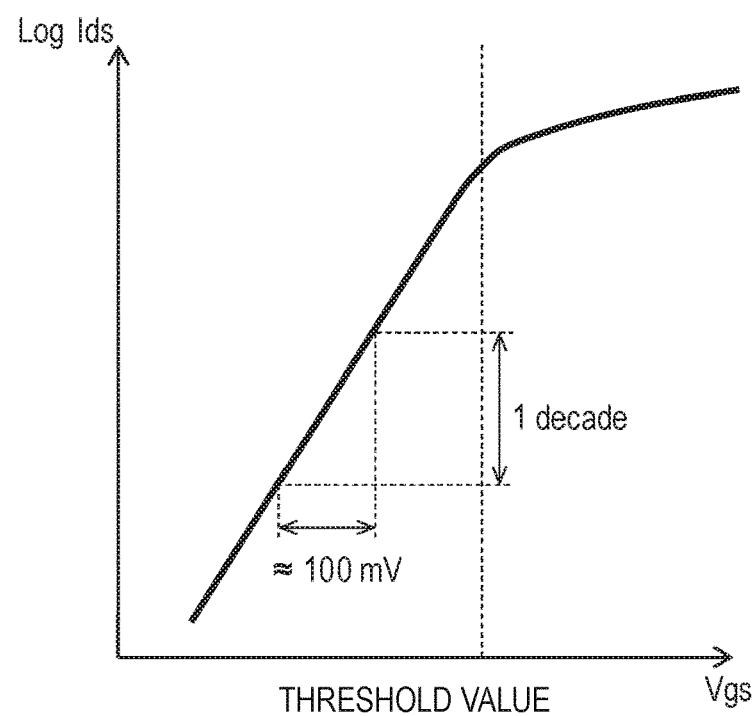

First, a solid-state imaging device according to the present embodiment will be described by using FIG. 1 to FIG. 5B. FIG. 1 is a block diagram illustrating a general configuration of a solid-state imaging device according to the present embodiment. FIG. 2 is a circuit diagram illustrating a configuration example of a pixel of the solid-state imaging device according to the present embodiment. FIG. 3 is a schematic cross-sectional view illustrating the structure of a pixel of the solid-state imaging device according to the present embodiment. FIG. 4 is a diagram illustrating a potential distribution of a pixel of the solid-state imaging device according to the present embodiment. FIG. 5A and FIG. 5B are graphs illustrating I-V characteristics in a sub-threshold region of a diode and a MOS transistor.

As illustrated in FIG. 1, a solid-state imaging device 100 according to the present embodiment includes a pixel region 10, a vertical scanning circuit 20, a column signal processing circuit 30, a horizontal scanning circuit 40, an output circuit 50, and a control circuit 60.

In the pixel region 10, a plurality of pixels 12 arranged in a matrix over a plurality of rows and a plurality of columns are provided. Each of the pixels 12 includes a photoelectric conversion unit formed of a photoelectric conversion element such as a photodiode and outputs a pixel signal in accordance with a light amount of an incident light. The number of rows and the number of columns of the pixel array arranged in the pixel region 10 are not particularly limited. Further, in the pixel region 10, optical black pixels in which the photoelectric conversion units are light-shielded, dummy pixels that do not output any signals, or the like may be arranged in addition to effective pixels that output pixel signals in accordance with the light amount of an incident light.

On each row of the pixel array of the pixel region 10, a control line 14 is arranged extending in a first direction (the lateral direction in FIG. 1). Each of the control lines 14 is connected to the pixels 12 aligned in the first direction, respectively, to form a signal line common to these pixels 12. The first direction in which the control line 14 extends may be referred to as a row direction or a horizontal direction. The control lines 14 are connected to the vertical scanning circuit 20.

On each column of the pixel array of the pixel region 10, an output line 16 is arranged extending in a second direction (the up-down direction in FIG. 1) crossing the first direction. Each of the output lines 16 is connected to the pixels 12 aligned in the second direction, respectively, to form a signal line common to these pixels 12. The second direction in which the output line 16 extends may be referred to as a column direction or a vertical direction. The output lines 16 are connected to the column signal processing circuit 30.

The vertical scanning circuit 20 is a control circuit unit that supplies, to the pixels 12 via the control lines 14 provided on respective rows of the pixel array, control signals used for driving readout circuits within the pixels 12 when signals are read out from the pixels 12. The vertical scanning circuit 20 can be configured by using shift registers or address decoders. Signals read out on a row basis from the pixels 12 are input to the column signal processing circuit 30 via the output lines 16 provided on respective columns of the pixel array.

The column signal processing circuit 30 is a circuit unit that performs predetermined signal processing, for example, signal processing such as an amplification process, an analog-to-digital (A/D) conversion process, or the like on a signal read out via the output line 16 from the pixel 12 on each column. A signal output from the pixel 12 includes a linear signal and a logarithmic compression signal. The column signal processing circuit 30 performs predetermined signal processing on each of the linear signal and the logarithmic compression signal output from the pixel 12. The column signal processing circuit 30 may include a signal holding unit, a column amplifier, a correlated double sampling (CDS) circuit, an adder circuit, an A/D conversion circuit, a column memory, or the like. Note that a linear signal and a logarithmic compression signal will be described later.

The horizontal scanning circuit 40 is a circuit unit that supplies, to the column signal processing circuit 30, control signals used for transferring signals processed in the column signal processing circuit 30 to the output circuit 50 sequentially on a column basis. The horizontal scanning circuit 40 can be configured by using shift registers or address decoders. The output circuit 50 is a circuit unit that is formed of a buffer amplifier, a differential amplifier, or the like and amplifies and outputs a signal of a column selected by the horizontal scanning circuit 40.

The control circuit 60 is a circuit unit that supplies, to the vertical scanning circuit 20, the column signal processing circuit 30, and the horizontal scanning circuit 40, control signals that control the operation of these circuits or the timing of the operation. Some or all of the control signals supplied to the vertical scanning circuit 20, the column signal processing circuit 30, and the horizontal scanning circuit 40 may be supplied from the outside of the solid-state imaging device 100.

As illustrated in FIG. 2, each of the pixels 12 includes a photodiode PD, a transfer transistor TX, a reset transistor RES, an amplifier transistor SF, a select transistor SEL, a p-n junction diode DIO, and a switch transistor SW.

The anode of the photodiode PD is connected to the ground node. The cathode of the photodiode PD is connected to the drain of the transfer transistor TX. The source of the transfer transistor TX is connected to the source of the switch transistor SW, the source of the reset transistor RES, and the gate of the amplifier transistor SF. The connection node of the source of the transfer transistor TX, the source of the switch transistor SW, the source of the reset transistor RES, and the gate of the amplifier transistor SF is a so-called floating diffusion portion FD. The floating diffusion portion FD includes a capacitance component (a floating diffusion capacitor) and has a function as a charge holding unit. In FIG. 2, this capacitance component coupled to the floating diffusion portion FD is represented as a capacitor element.

The drain of the reset transistor RES is connected to the node to which a reset voltage V_RES_D is supplied. The reset voltage V_RES_D is controlled to be able to take at least two values, which are, a first voltage and a second voltage. The first voltage is, for example, a power supply voltage (for example, 3.3 V). The second voltage is, for example, a voltage (for example, 1.0 V) that is lower by 0.2 V than the threshold voltage of the reset transistor RES.

The drain of the switch transistor SW is connected to the cathode of the p-n junction diode DIO. The anode of the p-n junction diode DIO is connected to the power supply node to which a voltage VDD is supplied. The drain of the amplifier transistor SF is connected to a power supply node to which the voltage VDD is supplied. The source of the amplifier transistor SF is connected to the drain of the select transistor SEL.

The output line 16 arranged on each column of the pixel region 10 is connected to the sources of the select transistors SEL of the pixels 12 aligned in the column direction, respectively, to form a signal line common to these pixels 12. Note that the select transistor SEL of the pixel 12 may be omitted. In such a case, the output line 16 is connected to the source of the amplifier transistor SF. A current source (not illustrated) is connected to the output line 16.

In the case of the pixel configuration illustrated in FIG. 2, the control line 14 on each row arranged in the pixel region 10 includes a signal line that supplies a control signal ptx, a control line that supplies a control signal pres, a control line that supplies a control signal psel, and a control line that supplies a control signal psw. The control signal ptx is supplied to the gate of the transfer transistor TX of the pixel 12 belonging to the corresponding row from the vertical scanning circuit 20 via the control line 14. The control signal pres is supplied to the gate of the reset transistor RES of the pixel 12 belonging to the corresponding row from the vertical scanning circuit 20 via the control line 14. The control signal psel is supplied to the gate of the select transistor SEL of the pixel 12 belonging to the corresponding row from the vertical scanning circuit 20 via the control line 14. The control signal psw is supplied to the gate of the switch transistor SW of the pixel 12 belonging to the corresponding row from the vertical scanning circuit 20 via the control line 14. When each transistor is formed of an n-channel transistor, a corresponding transistor is turned on when a high-level control signal is supplied from the vertical scanning circuit 20. Further, a corresponding transistor is turned off when a low-level control signal is supplied from the vertical scanning circuit 20.

Note that the control signal pres includes at least a first level and a second level. The first level is a level of voltage (for example, a power source voltage (3.3 V)) that controls the reset transistor RES to be in an on-state (a strong inversion state). The second level is a level of voltage (for example, a GND voltage) that controls the reset transistor RES to be in an off-state (an accumulation state).

The output line 16 arranged on each column of the pixel region 10 is connected to the sources of the select transistors SEL of the pixels 12 aligned in the column direction, respectively, to form a signal line common to these pixels 12. Note that the select transistor SEL of the pixel 12 may be omitted. In such a case, the output line 16 is connected to the source of the amplifier transistor SF. A current source (not illustrated) is connected to the output line 16. This current source is controlled by a bias circuit unit (not illustrated).

The photodiode PD converts (photoelectrically converts) an incident light into an amount of charges (electrons in this example) in accordance with a light amount and accumulates the generated charges. The transfer transistor TX is a transfer unit that transfers charges held in the photodiode PD to the floating diffusion portion FD. The floating diffusion portion FD holds charges transferred from the photodiode PD and sets the voltage of the input node of the amplifier unit (the gate of the amplifier transistor SF) to a voltage in accordance with the capacitance of the floating diffusion portion FD and the amount of the transferred charges. The floating diffusion portion FD is a charge-to-voltage conversion unit that converts charges into voltage proportional to the amount of charges. The reset transistor RES is a rest unit that resets the floating diffusion portion FD to a predetermined voltage in accordance with the reset voltage V_RES_D. The select transistor SEL selects the pixel 12 which outputs a signal to the output line 16. The amplifier transistor SF is configured such that the voltage VDD is supplied to the drain and a bias current is supplied to the source from a current source (not illustrated) via the select transistor SEL and forms an amplifier unit (a source follower circuit) whose gate is the input node. Thereby, the amplifier transistor SF outputs an amplified signal based on a voltage of the floating diffusion portion FD to the output line 16 via the select transistor SEL.

The p-n junction diode DIO and the switch transistor SW function as a logarithmic compression conversion unit used for logarithmically compressing and converting a current I_OFD, which overflows from the photodiode PD and flows into the floating diffusion portion FD via the transfer transistor TX, into a voltage. The switch transistor SW is a switch used for controlling a connection state (a conduction state and a non-conduction state) between the p-n junction diode DIO and a floating diffusion portion FD.

Note that the logarithmic compression conversion unit is not particularly limited as long as it can implement the function of the p-n junction diode DIO that converts the current I_OFD into a logarithmically compressed voltage and the function of controlling conduction/non-conduction between the p-n junction diode DIO and the floating diffusion portion FD. For example, the function of the logarithmic compression conversion unit can be realized by using the reset transistor RES instead (see a second embodiment).

FIG. 3 is a partial cross-sectional view of the pixel 12. FIG. 3 illustrates the photodiode PD (denoted as PD1 in FIG. 3), the transfer transistor TX, and the floating diffusion portion FD of one pixel 12 and the photodiode PD (denoted as PD2 in FIG. 3) of another pixel 12 adjacent to the one pixel 12. Further, FIG. 3 illustrates a logarithmic compression conversion unit connected to the floating diffusion portion FD by using a circuit diagram.

The photodiode PD includes a semiconductor region 112 of a first conductive type provided on the surface portion of a semiconductor substrate 110, a semiconductor region 114 of a second conductive type provided below the semiconductor region 112, and a semiconductor region 116 of the first conductive type provided in a deep portion of the semiconductor substrate 110. The semiconductor region 112 is a pinning layer that suppresses a dark current via a defect in the surface portion of the semiconductor substrate 110 (typically, an interface defect between the semiconductor substrate and an insulating film such as a silicon oxide film provided thereon. The semiconductor region 114 is a charge accumulation layer that accumulates signal charges generated by photoelectric conversion and forms a p-n junction between the semiconductor region 112 and the semiconductor region 114. The semiconductor region 116 is an embedding layer that suppresses a dark current from a deeper portion of the semiconductor substrate 110. When electrons are used as signal charges, the first conductive type is p-type, and the second conductive type is n-type. That is, the semiconductor regions 112 and 116 are p-type semiconductor regions, and the semiconductor region 114 is an n-type semiconductor region.

The floating diffusion portion FD is formed of a semiconductor region 118 of the second conductivity type provided apart from the semiconductor region 114 on the surface portion of the semiconductor substrate 110. A gate electrode 122 is provided above the semiconductor substrate 110 between the semiconductor region 114 and the semiconductor region 118 interposing the gate insulating film 120. Thereby, the transfer transistor TX is formed in which the semiconductor region 114 is the drain, the semiconductor region 118 is the source, and the gate electrode 122 is the gate.

An element isolation insulating portion 124 and semiconductor regions 126, 128, and 130 of the first conductive type are provided in a region between the pixels 12. The element isolation insulating portion 124 may be formed of an insulating material embedded in an element isolation groove provided in the surface portion of the semiconductor substrate 110, for example. The semiconductor regions 126, 128, and 130 are provided at different depths so as to be connected between the element isolation insulating portion 124 and the semiconductor region 118. Note that, in the present specification, the element isolation insulating portion 124 and the semiconductor regions 126, 128, and 130 may be collectively denoted as an element isolation portion ISO.

The photodiode PD converts (photoelectrically converts) an incident light into an amount of charges (electrons in this example) in accordance with a light amount and accumulates the generated charges in the semiconductor region 114. Thereby, the photodiode PD functions as a photo sensor. The sensitivity of the pixel 12 is defined by a range from the semiconductor region 112 as a pinning layer to the semiconductor region 116 as an embedding layer in the depth direction and defined by the element isolation portion ISO in the horizontal direction.

The saturation charge amount of the photodiode PD is approximately defined by the impurity concentration of a charge accumulation layer (the semiconductor region 114). When charges exceeding a saturation charge amount occur in the photodiode PD, the charges overflow toward the adjacent pixel 12, the semiconductor substrate 110, the floating diffusion portion FD, or the like as the overflow current I_OFD. The current overflowing to the adjacent pixel 12 causes image quality deterioration, which is so called blooming. The current overflowing to the semiconductor substrate 110 is drained via the semiconductor substrate 110.

The imaging device according to the present embodiment is configured to take advantage of the overflow current I_OFD as a part of a light signal by applying potential design so that the overflow current I_OFD overflows to the floating diffusion portion FD. For example, as seen in the equivalent circuit illustrated in FIG. 3, the p-n junction diode DIO is connected to the floating diffusion portion FD to extract the overflow current I_OFD as a logarithmic compression voltage. With such a configuration, a large light mount of incident light can be read out with a voltage amplitude that is relatively easy to handle (up to 0.5 V).

FIG. 4 is a potential diagram illustrating a one-dimensional potential taken along a line A-A' of FIG. 3 when the transfer transistor TX is in an off-state. The part from point A to point A' of FIG. 3 corresponds to the charge accumulation layer of the adjacent pixel (PD2), the element isolation portion (ISO), the charge accumulation layer of the pixel of interest (PD1), the channel portion of the transfer transistor (TX), the floating diffusion portion (FD), and the element isolation portion (ISO) in this order. In FIG. 4, a case where signal charges are electrons is taken into consideration, and thus the positive electric potential direction is represented as the downward direction, and the negative electric potential direction is represented as the upward direction.

One may easily understand a potential diagram when seeing the potential diagram as being schematically represented by a bucket storing the accumulated charges (electrons in this example). For example, it is assumed that the charge accumulation layer (PD1) of the photodiode is in a state where all the charges have been drained (depleting voltage Vdep=2 V). Further, it is assumed that 0 V is provided to the element isolation portion (ISO) via an electrode (not illustrated). Further, the electric potential of the transfer transistor channel portion (TX) is 0.5 V. In this case, between the charge accumulation layer (PD1) and the element isolation portion (ISO), there is a potential barrier corresponding to the electric potential difference of 2 V between the electric potential of the charge accumulation layer (PD1) and the electric potential of the element isolation portion (ISO). Further, between the transfer transistor channel portion (TX) and the charge accumulation layer (PD1), there is a potential barrier corresponding to the electric potential difference of 1.5 V between the electric potential of the transfer transistor channel portion (TX) in an off-state and the electric potential of the charge accumulation layer (PD1). When the charge accumulation amount of the charge accumulation layer (PD1) exceeds the saturation charge amount, the excess charges overflow in a direction of a lower potential barrier. In the case of the example described above, charges exceeding a saturation charge amount go over the potential barrier of the transfer transistor channel portion (TX) and overflow to the floating diffusion portion FD.

The upper limit of an amount of charges (a saturation charge amount Q) that can be accumulated in the charge accumulation layer (PD1) is Q=1.5×C, where the electric potential difference between the electric potential of the transfer transistor channel portion (TX) and the electric potential of the charge accumulation layer (PD1) is 1.5 V and the charge accumulation amount of the charge accumulation layer (PD1) is C.

FIG. 5A is a graph illustrating a general current-to-voltage characteristic of a p-n junction diode. The horizontal axis represents an electric potential difference Vpn between the anode and the cathode, and the vertical axis represents a current value Ipn (Log Ipn) on logarithmic axis representation.

As illustrated in FIG. 5A, an ideal slope factor S of a sub-threshold region in a silicon diode is around 60 mV/dec. That is, every 60 mV of change in the electric potential difference Vpn causes one-digit change in the current amount. Further, if it is assumed that the current amount near a threshold voltage is around $1 \times 10^{-7}$ to $1 \times 10^{-6}$ A, it is calculated that around $1 \times 10^{12}$ electrons per second flow. Given that the saturation charge amount (the number of electrons) in the charge accumulation layer in a pixel having a size of around 5 μm×5 μm is around $1 \times 10^5$, the charge amount flowing per second is larger by around seven digits. Therefore, by utilizing the sub-threshold characteristic of a p-n junction diode, it is possible to extract a signal corresponding to a significantly wide range of light amount.

FIG. 5B is a graph illustrating a general Ids-Vgs characteristic of a MOS transistor. The horizontal axis represents the voltage Vgs between the gate and the source, and the vertical axis represents a drain-to-source current Ids (Log Ids) on logarithmic axis representation.

As illustrated in FIG. 5B, the Ids-Vgs characteristic of a MOS transistor is substantially the same as the characteristic of a p-n junction diode illustrated in FIG. 5A except that the ideal slope factor S of the sub-threshold region is around 100 mV/dec. That is, also in a MOS transistor, it is possible to extract a signal corresponding to a significantly wide range of light amount by utilizing the sub-threshold characteristic as with the case of a p-n junction diode.

In the present specification, a signal obtained by utilizing a characteristic of the sub-threshold region in a diode or a MOS transistor to logarithmically compress and converting a current into a voltage is referred to as a logarithm compression signal. Further, a signal obtained by utilizing charge-to-voltage conversion with a capacitor element to convert charges to a voltage proportional to the amount thereof is referred to as a linear signal.

Figure 6:
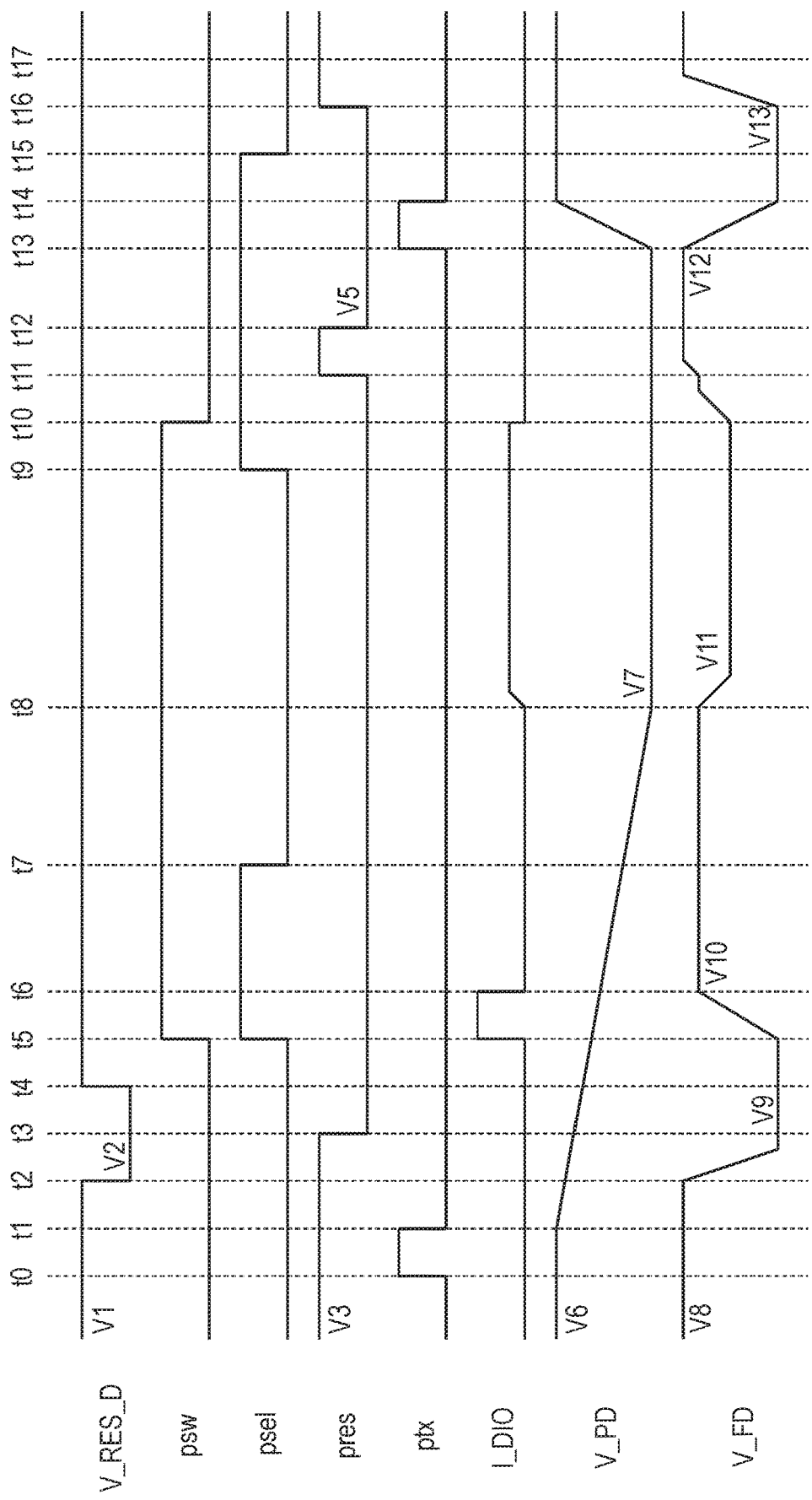
FIG. 6 is a timing chart illustrating a method of driving the solid-state imaging device according to the first embodiment of the present invention.
Figure 7A:
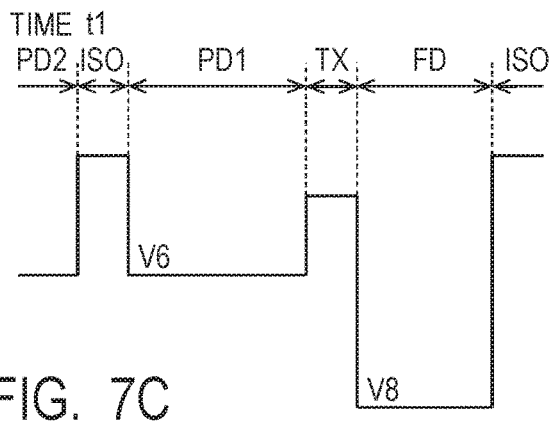
FIG. 7A, FIG. 7B, FIG. 7C, FIG. 7D, FIG. 7E, FIG. 7F and FIG. 7G are potential diagrams illustrating the operation of the solid-state imaging device according to the first embodiment of the present invention.
Figure 7B:
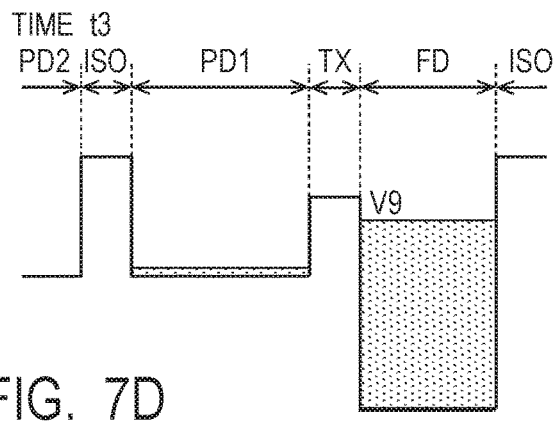
Figure 7C:
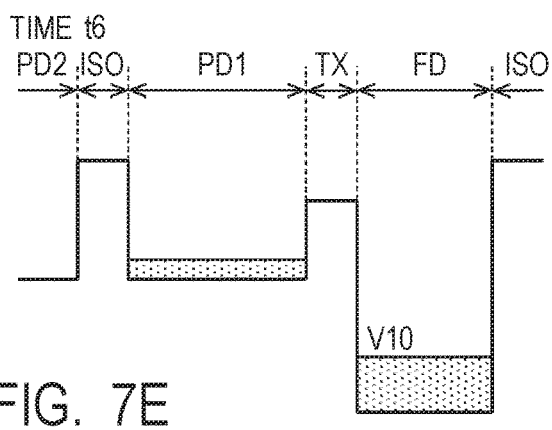
Figure 7D:
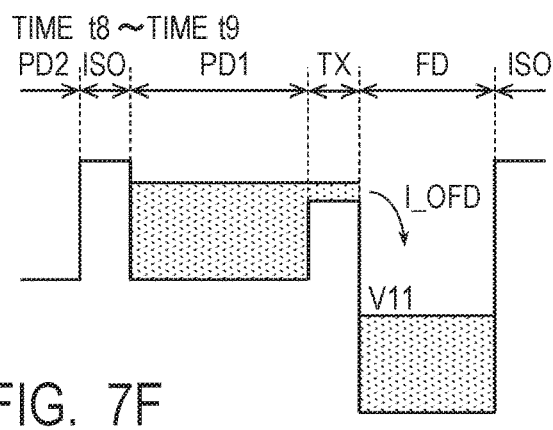
Figure 7E:
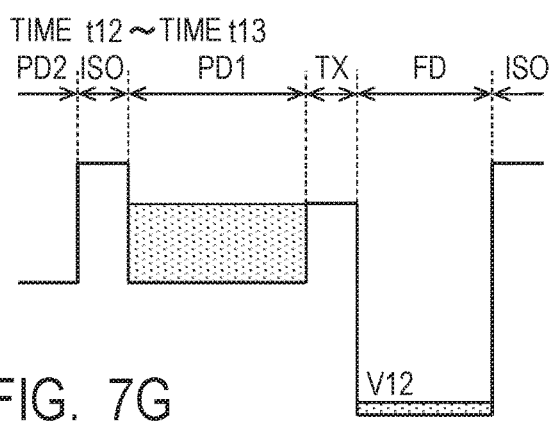
Figure 7F:
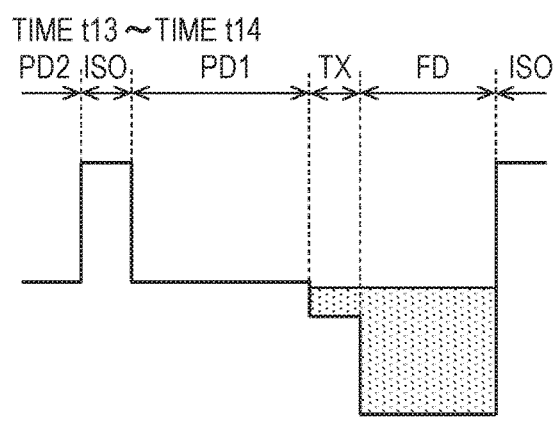
Figure 7G:
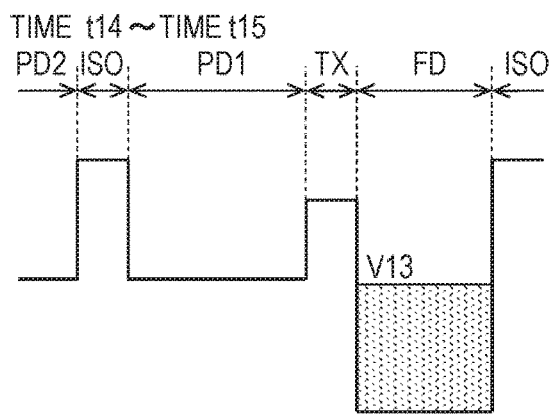

Next, a method of driving the solid-state imaging device according to the present embodiment will be described by using FIG. 6 to FIG. 7G. FIG. 6 is a timing chart illustrating the method of driving the solid-state imaging device according to the present embodiment. FIG. 7A to FIG. 7G are potential diagrams illustrating the operation of the solid-state imaging device according to the present embodiment.

FIG. 6 is a timing chart representing the operation for one frame when one pixel 12 is focused on. FIG. 6 illustrates the reset voltage V_RES_D, the control signals psw, psel, pres, and ptx, the current I_DIO, the voltage V_PD, and the voltage V_FD. The reset voltage V_RES_D is a voltage supplied to the drain of the reset transistor RES. The control signal psw is a signal supplied to the gate of the switch transistor SW. The control signal psel is a signal supplied to the gate of the select transistor SEL. The control signal pres is a signal supplied to the gate of the reset transistor RES. The control signal ptx is a signal supplied to the gate of the transfer transistor TX. The current I_DIO is a current flowing in the p-n junction diode DIO. The voltage V_PD is a voltage of the photodiode PD (charge accumulation layer). The voltage V_FD is a voltage of a floating diffusion portion FD.

Each transistor forming the pixel 12 is an n-channel transistor, a corresponding transistor is turned on when a high-level control signal is supplied, and a corresponding transistor is turned off when a low-level control signal is supplied.

Before the time t0, the reset voltage V_RES_D is a voltage V1, the control signal pres is at the high level (voltage V3), the control signals psw, psel, and ptx are at the low level. In this state, the reset transistor RES is in an on-state, and a voltage V1 is written to the floating diffusion portion FD via the reset transistor RES. Thereby, the voltage V_FD of the floating diffusion portion FD becomes a voltage V8, which is equal to the voltage V1. The voltage V1 (the reset voltage V_RES_D) can be set to 3.3 V, which is the power source voltage, for example.

Next, in the period from the time t0 to the time t1, the control signal ptx is controlled to the high level by the vertical scanning circuit 20. Thereby, the transfer transistor TX is turned on, and the photodiode PD is reset to a voltage in accordance with the reset voltage V_RES_D via the reset transistor RES and the transfer transistor TX. At this time, since the photodiode PD is depleted, the voltage V_PD of the photodiode PD rises to the depleting voltage (a voltage V6, for example, 2.0 V) but does not become the same voltage as the voltage V_FD. With the above operation, all the charges within the photodiode PD are drained.

Next, at the time t1, the control signal ptx is controlled to the low level by the vertical scanning circuit 20. Thereby, the transfer transistor TX is turned off, the photodiode PD is in a floating state separated from the floating diffusion portion FD. The charges generated by the photodiode PD due to a light incidence are then accumulated in the charge accumulation layer of the photodiode PD. The time t1 is the start time of charge accumulation in the photodiode PD. From the time t1, the voltage V_PD of the photodiode PD gradually decreases from the voltage V6 in response to accumulation of charges to the photodiode PD. FIG. 7A is a potential diagram resulted immediately after the start of charge accumulation (time t1) in the photodiode PD.

Next, at the time t2, the reset voltage V_RES_D is controlled from the voltage V1 to the voltage V2, which is lower than the voltage V1, by the vertical scanning circuit 20 or the control circuit 60. The voltage V2 can be set to 1.0 V, for example. At this time, the reset transistor RES is in an on-state, the voltage V2 is written to the floating diffusion portion FD via the reset transistor RES. Thereby, the voltage V_FD of the floating diffusion portion FD is set to a voltage V9 that is lower than the voltage V8. The voltage V9 is a voltage for setting the p-n junction diode DIO to an operation point that is higher than the threshold voltage of the p-n junction diode DIO.

Next, at the time t3, the control signal pres is controlled to the low level by the vertical scanning circuit 20. Thereby, the reset transistor RES is turned off, and the floating diffusion portion FD is separated from the supply node of the reset voltage V_RES_D and is in a floating state. FIG. 7B is a potential diagram resulted immediately after the time t3.

Next, at the time t4, the reset voltage V_RES_D is controlled from the voltage V2 to the voltage V1 by the vertical scanning circuit 20 or the control circuit 60.

Next, at the time t5, the control signal psw is controlled to the high level by the vertical scanning circuit 20. Thereby, the switch transistor SW is turned on, the current I_DIO in accordance with the I-V characteristic illustrated in FIG. 5A flows in the p-n junction diode DIO, and the voltage V_FD of the floating diffusion portion FD increases. In response, the electric potential difference Vpn between the anode and the cathode of the p-n junction diode DIO decreases, and the current I_DIO sharply decreases around the threshold voltage of the p-n junction diode DIO. As a result, the voltage V_FD of the floating diffusion portion FD becomes a voltage V10 in accordance with the threshold voltage of the p-n junction diode DIO. That is, the voltage V10 is a voltage defined in accordance with the threshold voltage of the p-n junction diode DIO.

The time t6 is the time when the electric potential difference Vpn between the anode and the cathode of the p-n junction diode DIO becomes less than the threshold voltage, the current I_DIO stops flowing (the p-n junction diode DIO is turned off), and the voltage V_FD of the floating diffusion portion FD becomes the voltage V10. FIG. 7C is a potential diagram resulted immediately after the time t6.

Further, similarly at the time t5, the control signal psel is controlled to the high level by the vertical scanning circuit 20 to turn on the select transistor SEL. Thereby, the pixel 12 is in a selected state, and a signal in accordance with the voltage V_FD of the floating diffusion portion FD is output to the output line 16 via the amplifier transistor SF and the select transistor SEL. The voltage signal output from the pixel 12 from the time t6 at which the voltage V_FD of the floating diffusion portion FD is the voltage V10 is a reference signal N1 for a logarithmic compression signal.

Next, at the time t7 after the time t6, the control signal psel is controlled to the low level by the vertical scanning circuit 20 to turn off the select transistor SEL. Thereby, selection of the pixel 12 is released.

At the subsequent time t8, it is assumed that the amount of charges accumulated in the charge accumulation layer exceeds the saturation charge amount of the photodiode PD due to the accumulation operation of charges in the photodiode PD that started at and continues from the time t1. Once reaching a voltage V7 (for example, around 0 V) corresponding to the saturation charge amount, the voltage V_PD of the photodiode PD no longer decreases.

The charges generated by the photodiode PD beyond the saturation charge amount go over the potential barrier of the channel portion of the transfer transistor TX and overflow to the floating diffusion portion FD. At this time, since the switch transistor SW is in an on-state, charges that have overflowed from the photodiode PD flow into the p-n junction diode DIO as the current I_DIO. As a result, the current flowing from the p-n junction diode DIO to the photodiode PD via the switch transistor SW and the transfer transistor TX is the overflow current I_OFD. With the overflow current I_OFD flowing to the p-n junction diode DIO, the voltage V_FD of the floating diffusion portion FD becomes a voltage V11 in accordance with the I-V characteristic illustrated in FIG. 5A. That is, the voltage obtained by logarithmically compressing a current based on charges overflowing from the photodiode PD to the floating diffusion portion FD is the voltage V11. The differential voltage between the voltage V10 and the voltage V11 corresponds to the voltage of the floating diffusion portion FD that varies by the overflow current I_OFD flowing to the p-n junction diode DIO whose operational point is set to the sub-threshold region.

Next, at the time t9, the control signal psel is controlled to the high level by the vertical scanning circuit 20 to turn on the select transistor SEL. Thereby, the pixel 12 is again selected, and the voltage V_FD of the floating diffusion portion FD, that is, a signal in accordance with the voltage V11 is output to the output line 16 via the amplifier transistor SF and the select transistor SEL. The output signal in accordance with the voltage V11 is a logarithmic compression signal S1. FIG. 7D is a potential diagram corresponding to the period from the time t8 to the time t9.

Next, at the time t10, the control signal psw is controlled to the low level by the vertical scanning circuit 20 to turn off the switch transistor SW. Thereby, the p-n junction diode DIO is separated from the floating diffusion portion FD, and the current I_DIO no longer flows.

Next, the period from the time t11 to the time t12, the control signal pres is controlled to the high level (voltage V3) by the vertical scanning circuit 20. Thereby, the reset transistor RES is turned on, and the voltage V1 is written to the floating diffusion portion FD via the reset transistor RES.

Next, at the time t12, the control signal pres transitions to the low level (voltage V5), the reset transistor RES is turned off, thereby the floating diffusion FD is in a floating state, and the voltage V_FD of the floating diffusion portion FD is a voltage V12. Thereby, a signal in accordance with the voltage V_FD (=V12) of the floating diffusion portion FD is output to the output line 16 via the amplifier transistor SF and the select transistor SEL. The voltage signal output from the pixel 12 from the time t12 at which the voltage V_FD of the floating diffusion portion FD is the voltage V12 is a reference signal N2 for a linear signal. FIG. 7E is a potential diagram corresponding to the period from the time t12 to the time t13.

Next, in the period from the time t13 to the time t14, the control signal ptx is controlled to the high level by the vertical scanning circuit 20. Thereby, the potential barrier of the channel portion of the transfer transistor TX becomes lower than the potential of the charge accumulation layer of the photodiode PD, and charges that have been accumulated in the photodiode PD are transferred to the floating diffusion portion FD. FIG. 7F is a potential diagram corresponding to the period from the time t13 to the time t14.

Next, at the time t14, the control signal ptx transitions to the low level, the transfer transistor TX is turned off, thereby the floating diffusion portion FD is in a floating state, and the voltage V_FD of the floating diffusion portion FD becomes a voltage V13. The voltage V13 is a voltage proportional to the amount of charges transferred from the photoelectric conversion unit. Thereby, a signal in accordance with the voltage V_FD (=V13) of the floating diffusion portion FD is output to the output line 16 via the amplifier transistor SF and the select transistor SEL. The voltage signal output form the pixel 12 from the time t14 at which the voltage V_FD of the floating diffusion portion FD is the voltage V13 is a linear signal S2. FIG. 7G is a potential diagram corresponding to the period from the time t14 to the time t15.

Next, at the time t15, the control signal psel is controlled to the low level by the vertical scanning circuit 20. Thereby, the select transistor SEL is turned off, and selection of the pixel 12 is released.

Next, at the time t16, the control signal pres is controlled to the high level by the vertical scanning circuit 20. Thereby, the reset transistor RES is turned on, and the voltage V_FD of the floating diffusion portion FD is reset to a predetermined electric potential in accordance with the voltage V1. With the voltage V_FD of the floating diffusion portion FD being stabilized at the voltage V8, which is equal to the voltage V1 (see the time t17), the pixel 12 returns to the initial state corresponding to the time to.

By driving the solid-state imaging device 100 in such a way, based on a voltage occurring at the floating diffusion portion FD, it is possible to acquire the reference signal N1 and the logarithmic compression signal S1 for a logarithmic compression signal and the reference signal N2 and the linear signal S2 for a linear signal.

Here, a voltage Vb (=|V13−V12|) obtained by subtracting the reference signal N2, which is a noise component, from the linear signal S2 is expressed by Q/Cfd, where the capacitance of the floating diffusion portion FD is denoted as Cfd and the amount of charges transferred to the floating diffusion portion FD is denoted as Q. Further, a voltage Va obtained by subtracting the reference signal N1, which is a noise component, from the logarithmic compression signal S1 can be converted into a linear signal, when a slope factor is denoted as S, the FD capacitance is denoted as Cfd, an integration period is t8−t6, and a correction coefficient for the integration period is denoted as k1. Here, the voltage Va is Va=(|V11−V10|). The slope factor S is S=60 mV/dec. The correction coefficient k1 is for subtracting optical charges accumulated in the photodiode PD that do not contribute to an overflow current. That is, when the current flowing in the p-n junction diode DIO in the period from the time t6 to the time t8 is denoted as I_DIO (for example, $1 \times 10^{-12}$ A), the voltage Vc resulted by converting the voltage Va into a linear signal is expressed by Equation (1) below.

$$Vc = 1/Cfd \times 10^{\wedge}(Va/S) \times I\_DIO \times k1 \times (t8-t6) \quad (1)$$

Since the voltage Vb and the voltage Vc are expressed as values of the same dimension, the light amount can be calculated as a value that is linear to Vb+Vc, namely, the addition of both the values.

As described above, according to the present embodiment, it is possible to continuously read out a logarithmic compression signal obtained by utilizing a sub-threshold characteristic of a diode and a linear signal read out by a transfer operation of charges accumulated in a photodiode. Thereby, a high quality image having a wide dynamic range can be acquired based on a logarithmic compression signal and a linear signal that are superior in concurrency.

Second Embodiment

A solid-state imaging device and a method of driving the same according to a second embodiment of the present invention will be described with reference to FIG. 8 to FIG. 11G. Components similar to those of the solid-state imaging device according to the first embodiment will be labeled with the same references, and the description thereof will be omitted or simplified.

Figure 8:
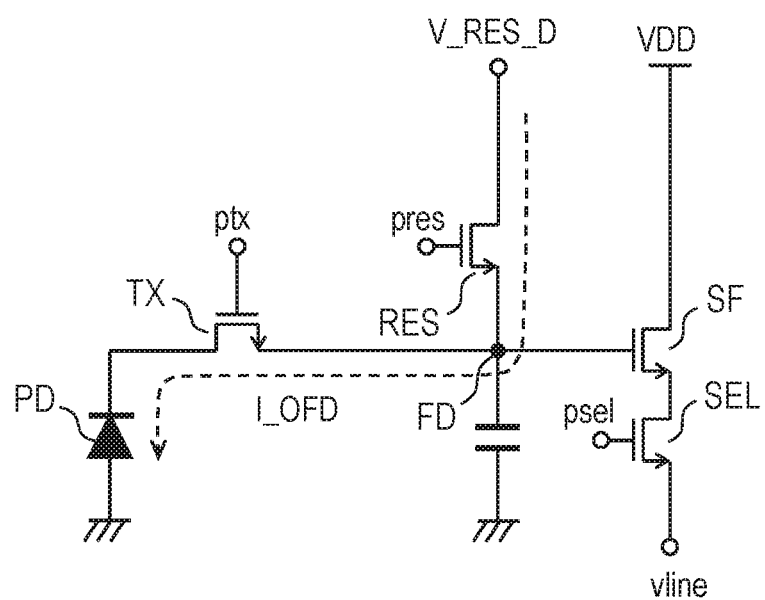
FIG. 8 is a circuit diagram illustrating a configuration example of a pixel of a solid-state imaging device according to a second embodiment of the present invention.
Figure 9:
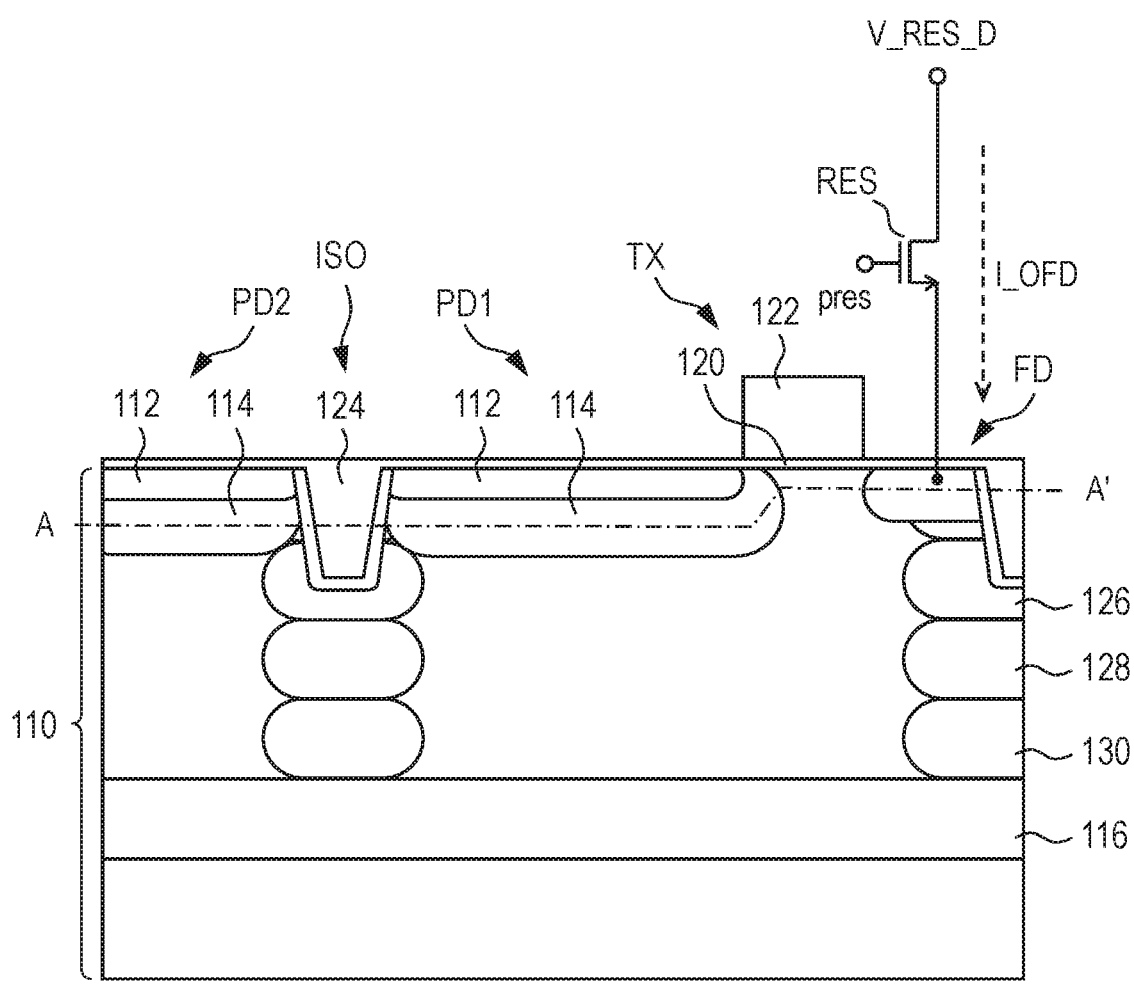
FIG. 9 is a schematic cross-sectional view illustrating the structure of a pixel of the solid-state imaging device according to the second embodiment of the present invention.

First, the solid-state imaging device according to the present embodiment will be described by using FIG. 8 and FIG. 9. FIG. 8 is a circuit diagram illustrating a configuration example of a pixel of the solid-state imaging device according to the present embodiment. FIG. 9 is a schematic cross-sectional view illustrating the structure of a pixel of the solid-state imaging device according to the present embodiment.

As illustrated in FIG. 8 and FIG. 9, the solid-state imaging device according to the present embodiment is the same as the solid-state imaging device according to the first embodiment except that the pixel 12 includes neither the p-n junction diode DIO nor the switch transistor SW. In the solid-state imaging device according to the present embodiment, the functions of the p-n junction diode DIO and the switch transistor SW in the solid-state imaging device according to the first embodiment are implemented by the reset transistor RES. That is, in the present embodiment, the reset transistor RES has the function as a logarithmic compression conversion unit.

In the present embodiment, potential design such that the overflow current I_OFD flows into the floating diffusion portion FD via the reset transistor RES is applied to utilize the overflow current I_OFD as a part of a light output. By causing the overflow current I_OFD to the floating diffusion portion FD via the reset transistor RES and extracting the voltage of the floating diffusion portion FD as a logarithmic compression voltage, it is possible to read out a large light amount of incident light with a voltage amplitude that is relatively easy to handle (up to 0.5 V).

Note that, in the present embodiment, the control signal pres includes at least a first level, a second level, and a third level. The first level is a voltage (for example, a power source voltage) having a level that controls the reset transistor RES to be in an on-state (a strong inversion state). The second level is a voltage (for example, a GND voltage) having a level that controls the reset transistor RES to be in an off-state (an accumulation state). The third level is a level between the first level and the second level and is a voltage (for example, a power source voltage, −0.5 V) having a level that controls the reset transistor RES to be in an on state (a weak inversion state).

Figure 10:
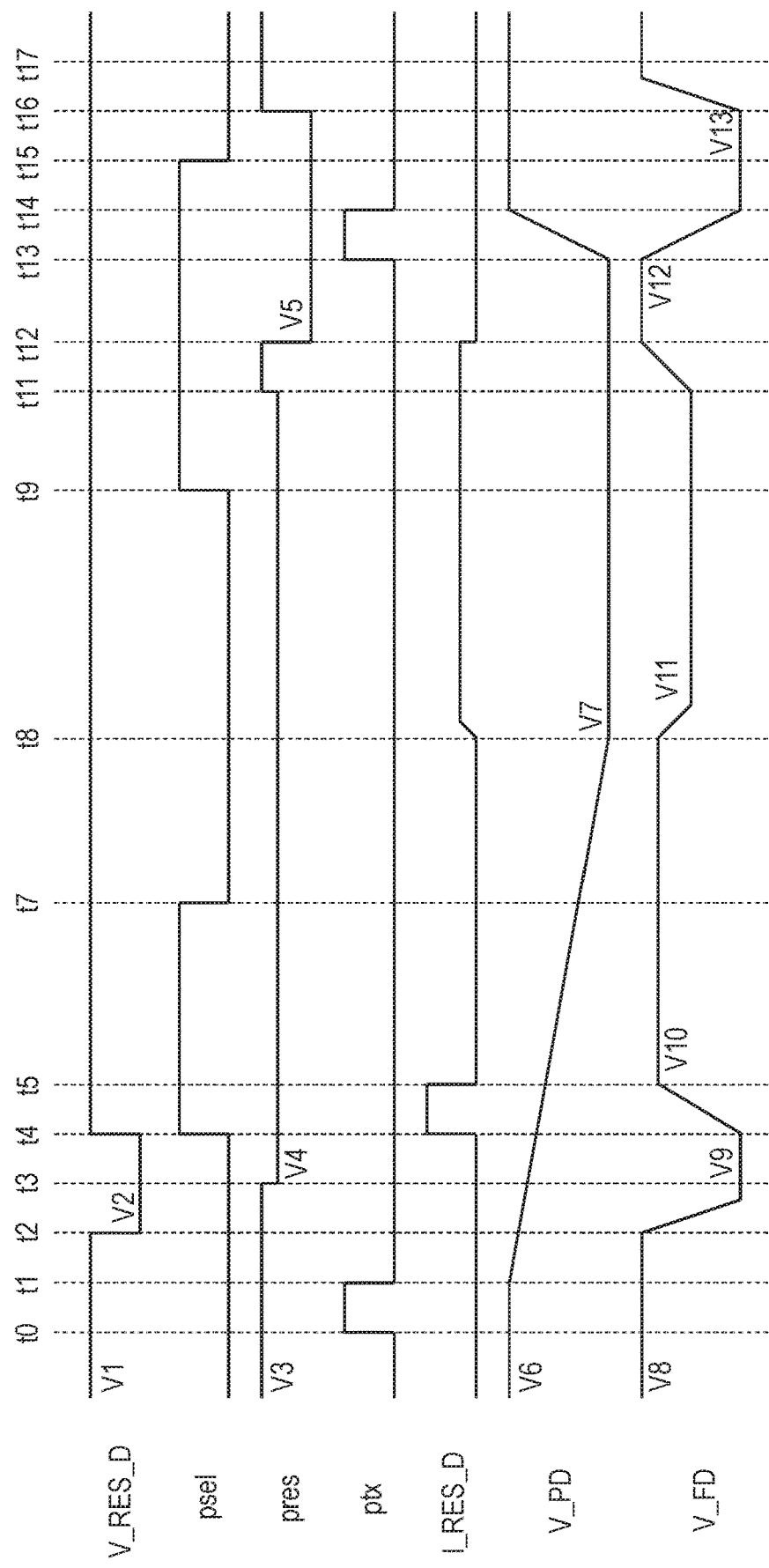
FIG. 10 is a timing chart illustrating a method of driving the solid-state imaging device according to the second embodiment of the present invention.
Figure 11A:
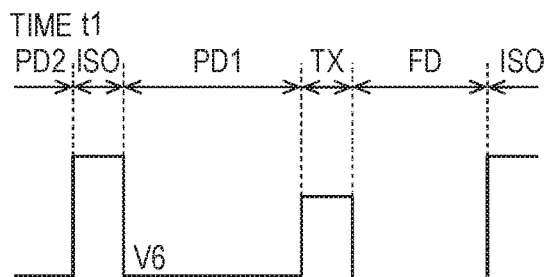
FIG. 11A, FIG. 11B, FIG. 11C, FIG. 11D, FIG. 11E, FIG. 11F and FIG. 11G are potential diagrams illustrating the operation of the solid-state imaging device according to the second embodiment of the present invention.
Figure 11B:
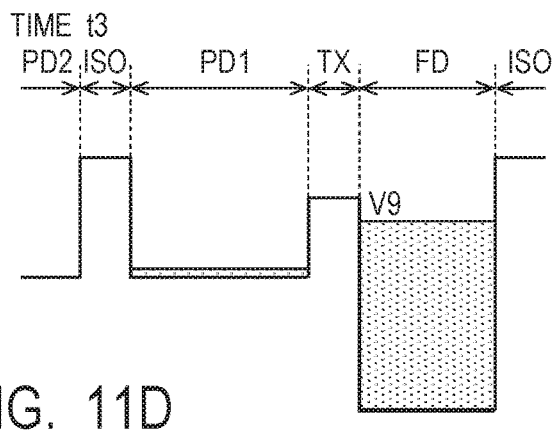
Figure 11C:
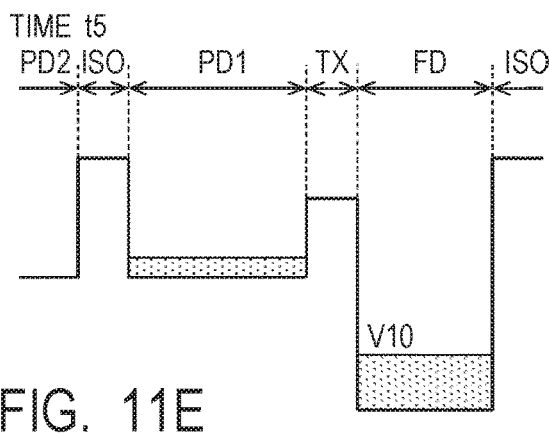
Figure 11D:
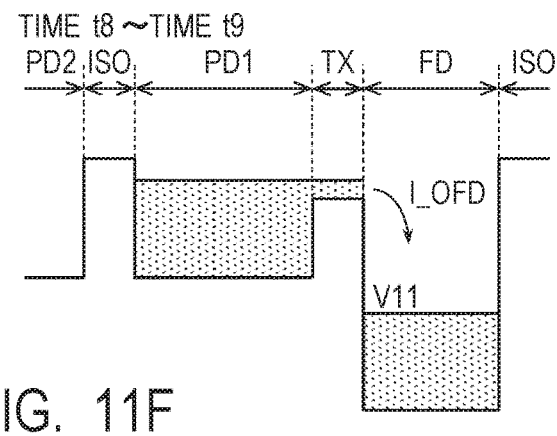
Figure 11E:
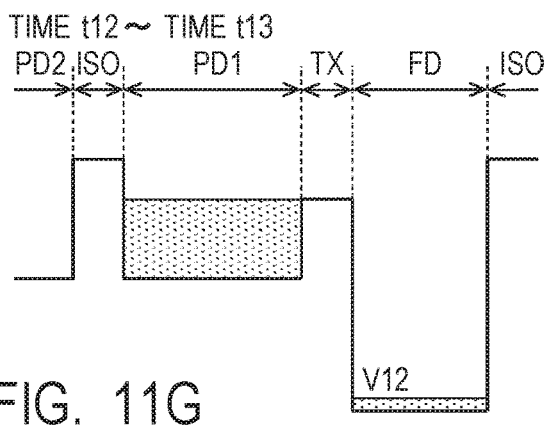
Figure 11F:
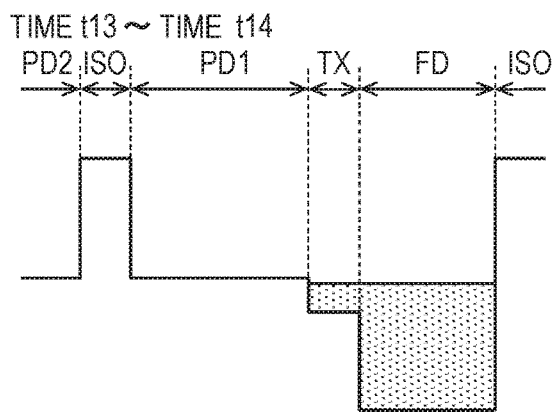
Figure 11G:
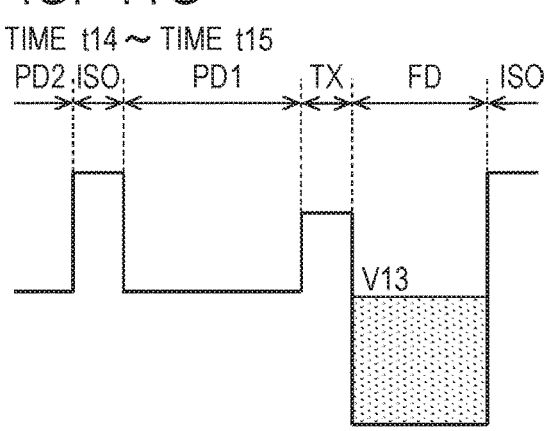

Next, the method of driving the solid-state imaging device according to the present embodiment will be described by using FIG. 10 to FIG. 11G. FIG. 10 is a timing chart illustrating the method of driving the solid-state imaging device according to the present embodiment. FIG. 11A to FIG. 11G are potential diagrams illustrating the operation of the solid-state imaging device according to the present embodiment.

FIG. 10 is a timing chart representing the operation for one frame focusing on one pixel 12. FIG. 10 illustrates the reset voltage V_RES_D, the control signals psel, pres, and ptx, the current I_RES_D, the voltage V_PD, and the voltage V_FD. The reset voltage V_RES_D, the control signals psel, pres, and ptx, the voltage V_PD, and the voltage V_FD are the same as those of FIG. 6. The current I_RES_D is a current flowing in the reset transistor RES. Each transistor forming the pixel 12 is an n-channel transistor, a corresponding transistor is turned on when a high-level control signal is supplied, and a corresponding transistor is turned off when a low-level control signal is supplied.

Before the time t0, the reset voltage V_RES_D is the voltage V1, the control signal pres is at the high level (voltage V3), the control signals psel and ptx are at the low level. In this state, the reset transistor RES is in an on-state, and a voltage V1 is written to the floating diffusion portion FD via the reset transistor RES. Thereby, the voltage V_FD of the floating diffusion portion FD becomes the voltage V8, which is equal to the voltage V1. The voltage V1 (the reset voltage V_RES_D) can be set to 3.3 V, which is the power source voltage, for example.

Next, in the period from the time t0 to the time t1, the control signal ptx is controlled to the high level by the vertical scanning circuit 20. Thereby, the transfer transistor TX is turned on, and the photodiode PD is reset to a voltage in accordance with a reset voltage V_RES_D via the reset transistor RES and the transfer transistor TX. At this time, since the photodiode PD is depleted, the voltage V_PD of the photodiode PD rises to the depleting voltage (a voltage V6, for example, 2.0 V) but does not become the same voltage as the voltage V_FD. With the above operation, all the charges within the photodiode PD are drained.

Next, at the time t1, the control signal ptx is controlled to the low level by the vertical scanning circuit 20. Thereby, the transfer transistor TX is turned off, the photodiode PD is in a floating state separated from the floating diffusion portion FD. The charges generated by the photodiode PD due to a light incidence are then accumulated in the charge accumulation layer of the photodiode PD. The time t1 is the start time of charge accumulation in the photodiode PD. From the time t1, the voltage V_PD of the photodiode PD gradually decreases from the voltage V6 in response to accumulation of charges to the photodiode PD. FIG. 11A is a potential diagram resulted immediately after the start of charge accumulation (time t1) in the photodiode PD.

Next, at the time t2, the reset voltage V_RES_D is controlled from the voltage V1 to the voltage V2, which is lower than the voltage V1, by the vertical scanning circuit 20 or the control circuit 60. The voltage V2 can be set to 1.0 V, for example. At this time, the reset transistor RES is in an on-state, the voltage V2 is written to the floating diffusion portion FD via the reset transistor RES. Thereby, the voltage V_FD of the floating diffusion portion FD is set to the voltage V9 that is lower than the voltage V8.

Next, at the time t3, the control signal pres is controlled to an intermediate voltage V4 that is lower than the high level voltage (voltage V3) and higher than the low level voltage (voltage V2, see FIG. 6) by the vertical scanning circuit 20. The voltage V4 can be set to a voltage of a level at which the reset transistor RES operates in the sub-threshold region for the overflow current I_OFD, for example, a voltage (2.8 V) lower by 0.5 V than the power source voltage. FIG. 11B is a potential diagram resulted immediately after the time t3.

Next, at the time t4, the reset voltage V_RES_D is controlled from the voltage V2 to the voltage V1 by the vertical scanning circuit 20 or the control circuit 60. Thereby, the current I_RES_D in accordance with the Ids-Vgs characteristic illustrated in FIG. 5B flows in the reset transistor RES, and the electric potential of the floating diffusion portion FD increases. In response, the voltage Vgs between the gate and the source of the reset transistor RES decreases, and the current I_RES_D sharply decreases around the threshold voltage of the reset transistor RES. As a result, the voltage V_FD of the floating diffusion portion FD becomes a voltage V10 in accordance with the threshold voltage of the reset transistor RES. That is, the voltage V10 is a voltage defined in accordance with the threshold voltage of the reset transistor RES when the reset transistor RES is operated in the sub-threshold region.

The time t5 is the time when the voltage Vgs between the gate and the source of the reset transistor RES becomes less than the threshold voltage, the current I_RES_D no longer flows (the reset transistor RES is turned off), and the voltage V_FD of the floating diffusion portion FD becomes the voltage V10. FIG. 11C is a potential diagram resulted immediately after the time t5.

Further, similarly at the time t4, the control signal psel is controlled to the high level by the vertical scanning circuit 20 to turn on the select transistor SEL. Thereby, the pixel 12 is in a selected state, and a signal in accordance with the voltage V_FD of the floating diffusion portion FD is output to the output line 16 via the amplifier transistor SF and the select transistor SEL. The voltage signal output from the pixel 12 from the time t5 at which the voltage V_FD of the floating diffusion portion FD is the voltage V10 is the reference signal N1 for a logarithmic compression signal.

Next, at the time t7 after the time t5, the control signal psel is controlled to the low level by the vertical scanning circuit 20 to turn off the select transistor SEL. Thereby, selection of the pixel 12 is released.

At the subsequent time t8, it is assumed that the amount of charges accumulated in the charge accumulation layer exceeds the saturation charge amount of the photodiode PD due to the accumulation operation of charges in the photodiode PD that started at and continues from the time t1. Once reaching the voltage V7 (for example, around 0 V) corresponding to the saturation charge amount, the voltage V_PD of the photodiode PD no longer decreases.

The charges generated by the photodiode PD beyond the saturation charge amount go over the potential barrier of the channel portion of the transfer transistor TX and overflow to the floating diffusion portion FD. At this time, since the reset transistor RES is in a weak inversion state, charges that have overflowed from the photodiode PD flow into the reset transistor RES as the current I_RES_D. As a result, the current flowing to the photodiode PD via the reset transistor RES and the transfer transistor TX is the overflow current I_OFD. With the overflow current I_OFD flowing to the reset transistor RES, the voltage V_FD of the floating diffusion portion FD becomes the voltage V11 in accordance with the Ids-Vgs characteristic illustrated in FIG. 5B. That is, the voltage obtained by logarithmically compressing a current based on charges overflowing from the photodiode PD to the floating diffusion portion FD is the voltage V11. The differential voltage between the voltage V10 and the voltage V11 corresponds to the voltage of the floating diffusion portion FD that varies by the overflow current I_OFD flowing to the reset transistor RES whose operational point is set to the sub-threshold region.

Next, at the time t9, the control signal psel is controlled to the high level by the vertical scanning circuit 20 to turn on the select transistor SEL. Thereby, the pixel 12 is again selected, and the voltage V_FD of the floating diffusion portion FD, that is, a signal in accordance with the voltage V11 is output to the output line 16 via the amplifier transistor SF and the select transistor SEL. The output signal in accordance with the voltage V11 is a logarithmic compression signal S1. FIG. 11D is a potential diagram corresponding to a period from the time t8 to the time t9.

Next, in the period from the time t11 to the time t12, the control signal pres is controlled from the intermediate level (voltage V4) to the high level (voltage V3) by the vertical scanning circuit 20. Thereby, the reset transistor RES is turned on, and the voltage V1 is written to the floating diffusion portion FD via the reset transistor RES.

Next, at the time t12, the control signal pres transitions to the low level (voltage V5), the reset transistor RES is turned off, thereby the floating diffusion portion FD is in a floating state, and the voltage V_FD of the floating diffusion portion FD is the voltage V12. Thereby, a signal in accordance with the voltage V_FD (=V12) of the floating diffusion portion FD is output to the output line 16 via the amplifier transistor SF and the select transistor SEL. The voltage signal output from the pixel 12 from the time t12 at which the voltage V_FD of the floating diffusion portion FD is the voltage V12 is the reference signal N2 for a linear signal. FIG. 11E is a potential diagram corresponding to the period from the time t12 to the time t13.

Next, in the period from the time t13 to the time t14, the control signal ptx is controlled to the high level by the vertical scanning circuit 20. Thereby, the potential barrier of the channel portion of the transfer transistor TX becomes lower than the potential of the charge accumulation layer of the photodiode PD, and charges that have been accumulated in the photodiode PD are transferred to the floating diffusion portion FD. FIG. 11F is a potential diagram corresponding to the period from the time t13 to the time t14.

Next, at the time t14, the control signal ptx transitions to the low level, the transfer transistor TX is turned off, thereby the floating diffusion portion FD is in a floating state, and the voltage V_FD of the floating diffusion portion FD becomes the voltage V13. The voltage V13 is a voltage proportional to the amount of charges transferred from the photoelectric conversion unit. Thereby, a signal in accordance with the voltage V_FD (=V13) of the floating diffusion portion FD is output to the output line 16 via the amplifier transistor SF and the select transistor SEL. The voltage signal output form the pixel 12 from the time t14 at which the voltage V_FD of the floating diffusion portion FD is the voltage V13 is the linear signal S2. FIG. 11G is a potential diagram corresponding to the period from the time t14 to the time t15.

Next, at the time t15, the control signal psel is controlled to the low level by the vertical scanning circuit 20. Thereby, the select transistor SEL is turned off, and selection of the pixel 12 is released.

Next, at the time t16, the control signal pres is controlled to the high level by the vertical scanning circuit 20. Thereby, the reset transistor RES is turned on, and the voltage V_FD of the floating diffusion portion FD is reset to a predetermined electric potential in accordance with the voltage V1. With the voltage V_FD of the floating diffusion portion FD being stabilized at the voltage V8, which is equal to the voltage V1 (see the time t17), the pixel 12 returns to the initial state corresponding to the time t0.

By driving the solid-state imaging device 100 in such a way, based on a voltage occurring at the floating diffusion portion FD, it is possible to acquire the reference signal N1 and the logarithmic compression signal S1 for a logarithmic compression signal and the reference signal N2 and the linear signal S2 for a linear signal.

Here, a voltage Vb (=|V13−V12|) obtained by subtracting the reference signal N2, which is a noise component, from the linear signal S2 is expressed by Q/Cfd, where the capacitance of the floating diffusion portion FD is denoted as Cfd and the amount of charges transferred to the floating diffusion portion FD is denoted as Q. Further, a voltage Va obtained by subtracting the reference signal N1, which is a noise component, from the logarithmic compression signal S1 can be converted into a linear signal, when a slope factor is denoted as S, the FD capacitance is denoted as Cfd, an integration period is t8−t5, and a correction coefficient for the integration period is denoted as k1. Here, the voltage Va is Va=|V11−V10|. The slope factor S is S=100 mV/dec. The correction coefficient k1 is for subtracting optical charges accumulated in the photodiode PD that do not contribute to an overflow current. That is, when the current flowing in the reset transistor RES in the period from the time t5 to the time t8 is denoted as I_RES_D (for example, 1×10$^{-12}$ A), the voltage Vc resulted by converting the voltage Va into a linear signal is expressed by Equation (2) below.

$$Vc=1/Cfd \times 10^{\wedge}(Va/S) \times I\_RES\_D \times k1 \times (t8-t5) \quad (2)$$

Since the voltage Vb and the voltage Vc are expressed as values of the same dimension, the light amount can be calculated as a value that is linear to Vb+Vc, namely, the addition of both the values.

As described above, according to the present embodiment, it is possible to continuously read out a logarithmic compression signal obtained by utilizing a sub-threshold characteristic of a MOS transistor and a linear signal read out by a transfer operation of charges accumulated in a photodiode. Thereby, a high quality image having a wide dynamic range can be acquired based on a logarithmic compression signal and a linear signal that are superior in concurrency.

Further, in the present embodiment, since a logarithmic compression signal is acquired by utilizing the reset transistor RES, it is not necessary to change the configuration of the pixel 12 in applying the present invention. Thereby, the advantage of the present invention can be obtained without sacrificing the resolution of an acquired image.

Third Embodiment

A signal processing method of a solid-state imaging device according to a third embodiment of the present invention will be described with reference to FIG. 12 and FIG. 13.

In the present embodiment, a method of processing a signal acquired by the solid-state imaging device according to the first and second embodiments will be described. The signal processing described in the present embodiment may be implemented in a signal processing unit arranged inside the same chip as that of the solid-state imaging device or may be implemented in a signal processing unit outside the solid-state imaging device. For example, the signal processing described in the present embodiment can be implemented in a signal processing unit (not illustrated) provided on the post-stage of the column signal processing circuit 30.

Alternatively, when an imaging system according to a fourth embodiment described later is configured by using the solid-state imaging device according to the first or second embodiment, the signal processing described in the present embodiment can be performed in an imaging device 201 or a signal processing unit 208. Note that the signal processing described in the present embodiment may be performed on an analog pixel signal or may be performed on a digital pixel signal when the column signal processing circuit 30 or the like includes an A/D conversion circuit.

Figure 12:
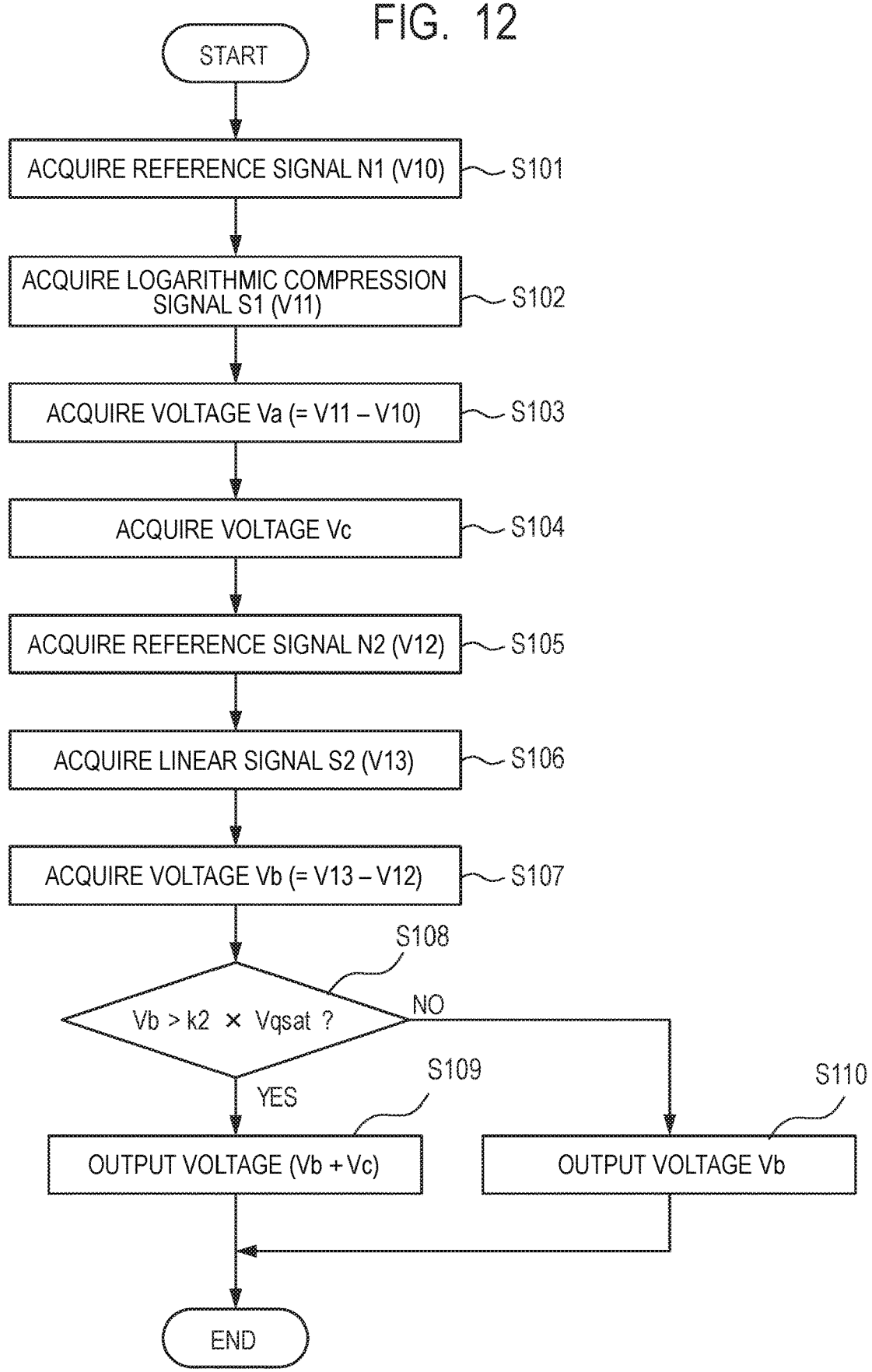
FIG. 12 is a flowchart illustrating a signal processing method of a solid-state imaging device according to a third embodiment of the present invention.

FIG. 12 is a flowchart illustrating a signal processing method of the solid-state imaging device according to the present embodiment. The signal processing method of the solid-state imaging device according to the present embodiment is performed according to step S101 to step S110 illustrated in FIG. 12.

First, the reference signal N1 for a logarithmic compression signal is acquired in the same manner as the procedure of the method of driving the solid-state imaging device according to the first or second embodiment (step S101).

Next, the logarithmic compression signal S1 is acquired in the same manner as the procedure of the method of driving the solid-state imaging device according to the first or second embodiment (step S102).

Next, the voltage Va is acquired based on the reference signal N1 acquired in step S101 and the logarithmic compression signal S1 acquired in step S102 (step S103). The voltage Va can be calculated by V11−V10, where the voltage of the reference signal N1 is denoted as V10 and the voltage of the logarithmic compression signal S1 is denoted as V11.

Next, the voltage Vc is acquired by using Equation (1) or Equation (2) based on the voltage Va acquired in step S103 (step S104).

Next, the reference signal N2 for a linear signal is acquired in the same manner as the procedure of the method of driving the solid-state imaging device according to the first or second embodiment (step S105).

Next, the linear signal S2 is acquired in the same manner as the procedure of the method of driving the solid-state imaging device according to the first or second embodiment (step S106).

Next, the voltage Vb is acquired based on the reference signal N2 acquired in step S105 and the linear signal S2 acquired in step S106 (step S107). The voltage Vb can be calculated by V13−V12, where the voltage of the reference signal N2 is denoted as V12 and the voltage of the linear signal S2 is denoted as V13.

Next, it is determined whether or not the voltage Vb is larger than k2×Vqsat (step S108). Here, the voltage Vqsat is an output voltage of the pixel 12 corresponding to the saturation charge amount Q of the photodiode PD. Further, k2 is a correction coefficient, which may range 0.5 to 1. This correction coefficient k2 is a value in accordance with the saturation charge amount Q and may be appropriately increased or decreased.

If the voltage Vb is larger than k2×Vqsat as a result of the determination, the process proceeds to step S109 and outputs Vb+Vc as an output signal corresponding to an incident light amount. If the voltage Vb is less than or equal to k2×Vqsat as a result of the determination, the process proceeds to step S110 and outputs Vb as an output signal corresponding to an incident light amount. That is, the voltage Vc acquired as a logarithmic compression signal is added to the output only when the voltage Vb acquired as a linear signal satisfies a certain level or higher with respect to an output voltage corresponding to the saturation charge amount Q of the photodiode PD.

Note that the flowchart illustrated in FIG. 12 illustrates an example of a basic signal processing procedure in accordance with the present embodiment, and the order of the process up to the determination of step S108 can be appropriately changed. For example, step S103 and step S104 may be performed after step S106 or step S107. Further, in step S108, while the criterion for determination is a condition as to whether or not the voltage Vb exceeds k2×Vqsat, the criterion for determination may be a predetermined value in accordance with the saturation charge amount Q and not necessarily required to be a value of k2 times the voltage Vqsat. For example, the value of k2 may be appropriately increased or decreased in accordance with a sample.

Figure 13:
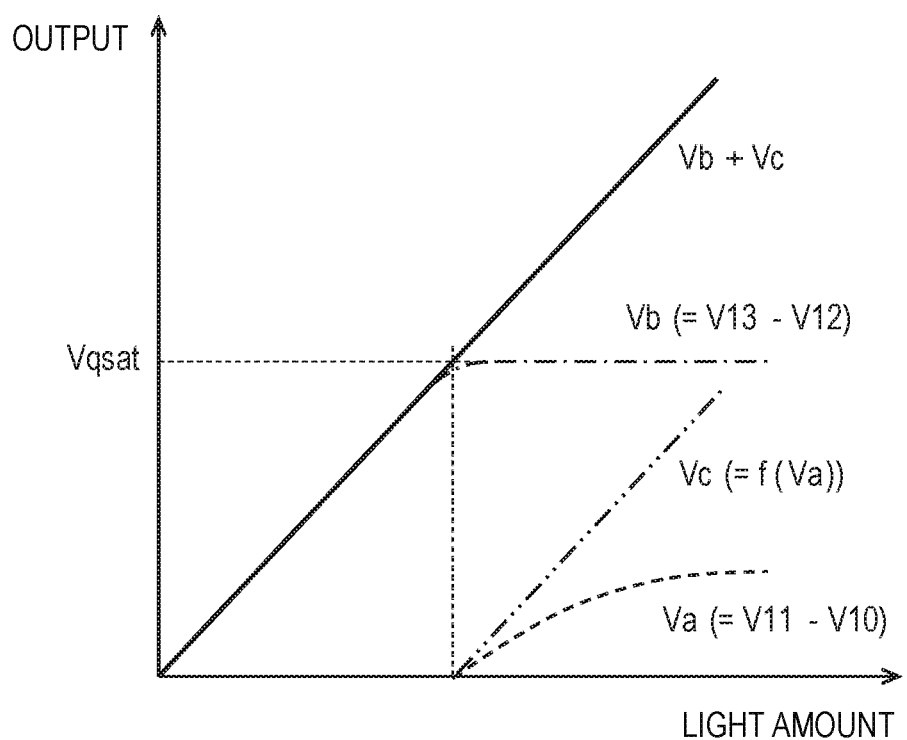
FIG. 13 is a graph illustrating a photoelectric conversion characteristic of the solid-state imaging device according to the first and second embodiments of the present invention.

FIG. 13 is a graph illustrating photoelectric conversion characteristics of the solid-state imaging device according to the first and second embodiments. The horizontal axis represents a light amount, and the vertical axis represents a sensor output voltage expressed in a linear axis. In FIG. 13, the dashed line represents a photoelectric conversion characteristic of the voltage Va, the one-dot chain line represents a photoelectric conversion characteristic of the voltage Vb, the two-dot chain line represents a photoelectric conversion characteristic of the voltage Vc, and a solid line represents a photoelectric conversion characteristic of the voltage (Vb+Vc).

While increasing proportionally with an incident light amount until the accumulated charge amount of the photodiode PD reaches the saturation charge amount Q, the voltage Vb is saturated at the voltage Vqsat once the accumulated charge amount of the photodiode PD exceeds the saturation charge amount Q. The voltage Va occurs based on a light amount at the point when the accumulated charge amount of the photodiode PD reaches the saturation charge amount Q. This corresponds to the fact that the voltage Va occurs as the overflow current I_OFD after the accumulation charge amount of the photodiode PD reaches the saturation charge amount Q. That is, a signal occurring as the voltage Va in a light amount less than or equal to the light amount corresponding to the voltage Vqsat can be considered as not being a light signal. Therefore, by performing the output determination by using the flow illustrated in FIG. 12, it is possible to improve signal quality in a low light amount.

As described above, according to the present embodiment, a high quality image having a wide dynamic range can be acquired by combining a logarithmic compression signal and a linear signal that are superior in concurrency.

Fourth Embodiment

Figure 15:
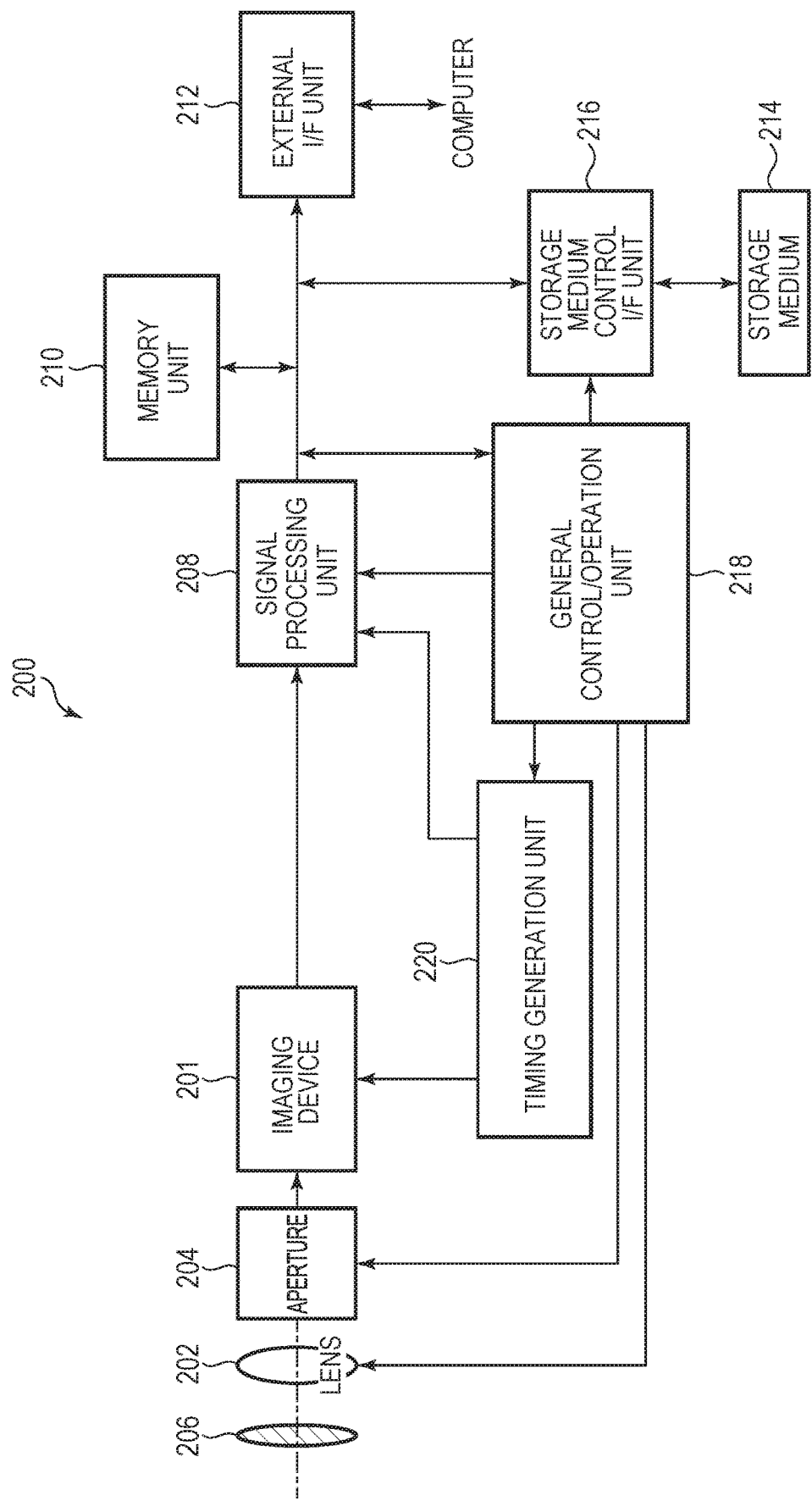
FIG. 15 is a block diagram illustrating a general configuration of an imaging system according to a fourth embodiment of the present invention.

An imaging system according to a fourth embodiment of the present invention will be described with reference to FIG. 15. FIG. 15 is a block diagram illustrating a general configuration of the imaging system according to the present embodiment.

The solid-state imaging device 100 described in the above first to third embodiments is applicable to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 15 illustrates a block diagram of a digital still camera as an example out of these examples.

The imaging system 200 illustrated as an example in FIG. 15 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the solid-state imaging device 100 described in any of the first to third embodiments and converts an optical image captured by the lens 202 into image data.

The imaging system 200 further includes a signal processing unit 208 that processes an output signal output from the imaging device 201. The signal processing unit 208 preforms A/D conversion that converts an analog signal output by the imaging device 201 into a digital signal. In addition, the signal processing unit 208 performs various correction and compression other than above, if necessary, and performs an operation of outputting image data. An A/D conversion unit, which is a part of the signal processing unit 208, may be formed on a semiconductor substrate on which the imaging device 201 is provided or may be formed on a different semiconductor substrate than that with the imaging device 201. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that controls various operations and the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 generates an image by using the imaging signal.

As discussed above, according to the present embodiment, the imaging system to which the solid-state imaging device 100 according to the first to third embodiments is applied can be realized.

Fifth Embodiment

Figure 16A:
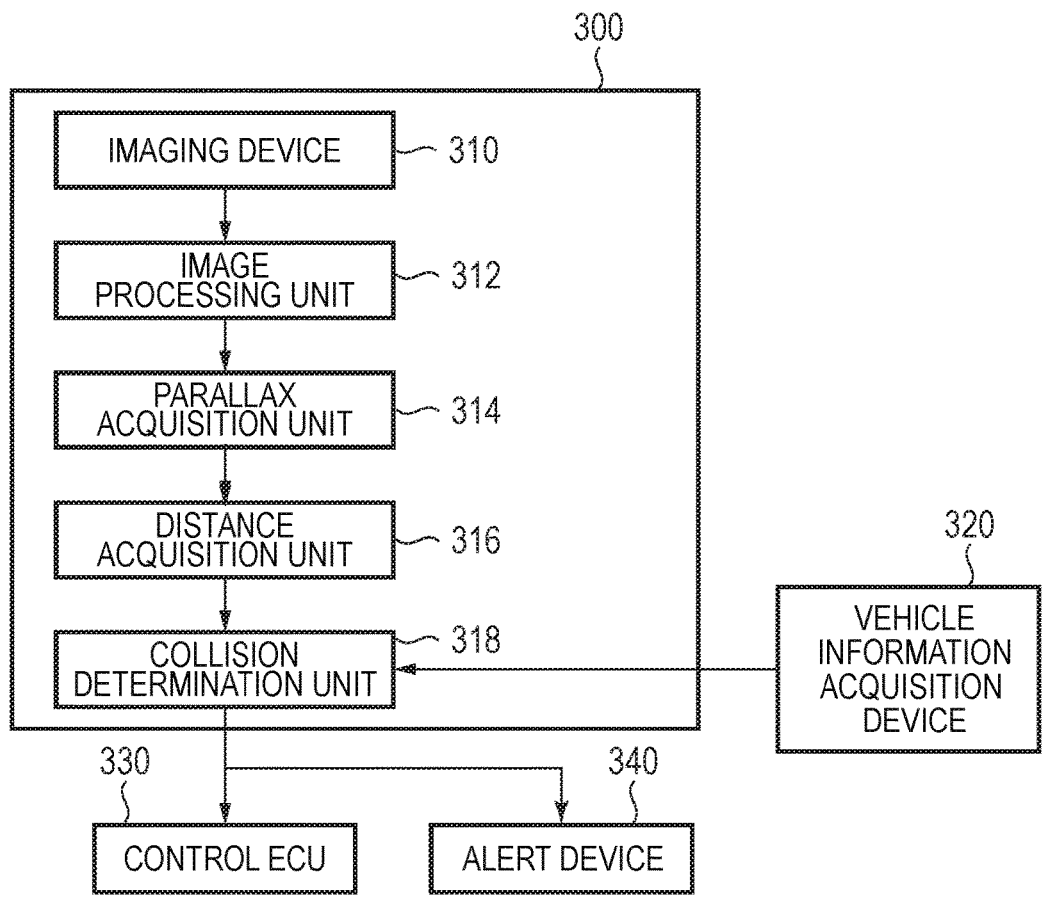
FIG. 16A is a diagram illustrating a configuration example of an imaging system according to a fifth embodiment of the present invention.
Figure 16B:
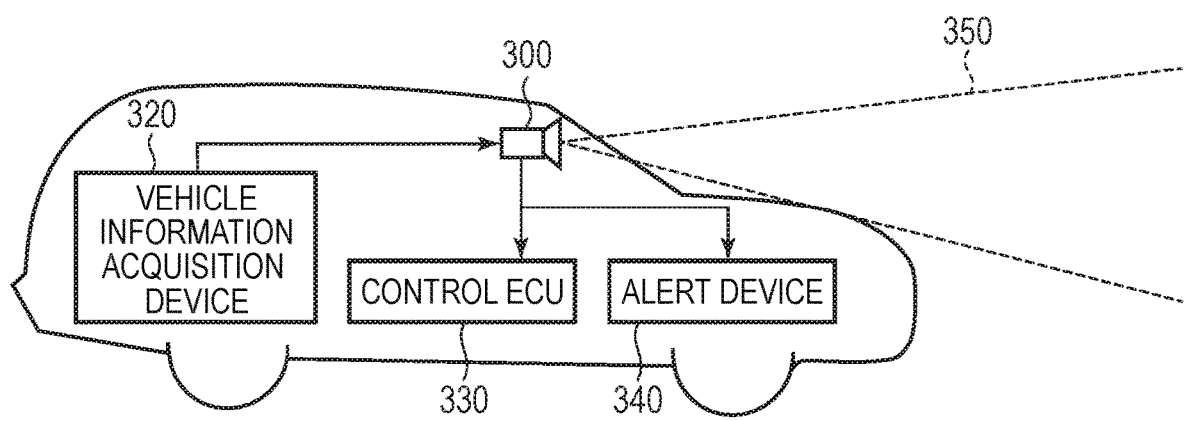
FIG. 16B is a diagram illustrating a configuration example of a movable object according to the fifth embodiment of the present invention.

An imaging system and a movable object according to a fifth embodiment of the present invention will be described with reference to FIG. 16A and FIG. 16B. FIG. 16A is a diagram illustrating a configuration of an imaging system according to the present embodiment. FIG. 16B is a diagram illustrating a configuration of a movable object according to the present embodiment.

FIG. 16A illustrates an example of an imaging system related to an on-vehicle camera. The imaging system 300 includes an imaging device 310. The imaging device 310 is the solid-state imaging device 100 described in any of the above first to third embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 16B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

MODIFIED EMBODIMENTS

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Figure 14:
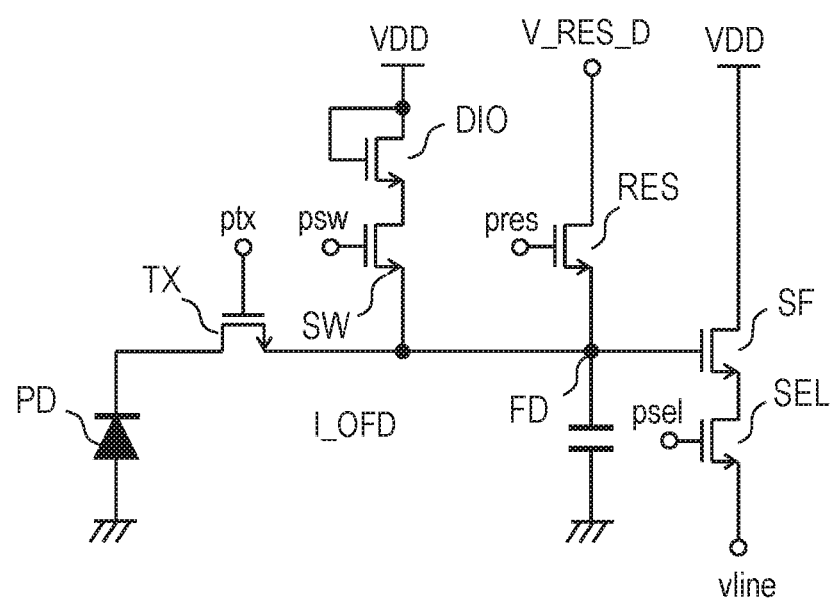
FIG. 14 is a circuit diagram illustrating a configuration example of a pixel of a solid-state imaging device according to a modified example of the first embodiment.

For example, while the example in which a p-n junction diode is applied as the diode DIO forming the logarithmic compression conversion unit has been described in the above first embodiment, a diode forming the logarithmic compression conversion unit is not necessarily required to be a p-n junction diode. The diode DIO forming a logarithmic compression conversion unit may be formed of a MOS diode in which the gate and the drain of a MOS transistor are short-circuited, as illustrated in FIG. 14, for example.

Further, while the case where electrons are used as signal charges has been described as an example in the above embodiments, the signal charges may be holes. In such a case, the conductive types of the semiconductor regions described above are opposite, and signal levels supplied to the transistors are inverted.

Further, the imaging systems illustrated in the above fourth and fifth embodiments are examples of an imaging system to which the photoelectric conversion device of the present invention may be applied, and an imaging system to which the photoelectric conversion device of the present invention can be applied is not limited to the configuration illustrated in FIG. 15 and FIG. 16A.

According to the present invention, it is possible to continuously read out a logarithmic compression signal obtained by utilizing a sub-threshold characteristic of a diode or a MOS transistor and a linear signal read out by a transfer operation of charges accumulated in a photodiode. Thereby, a high quality image having a wide dynamic range can be acquired based on a logarithmic compression signal and a linear signal that are superior in concurrency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-135004, filed Jul. 18, 2018 which is hereby incorporated by reference herein in its entirety.

What is claimed is:
1. A method of driving a solid-state imaging device including a photoelectric conversion unit that generates charges by photoelectric conversion and an amplifier unit that comprises an input node, the method comprising:
    setting a voltage of the input node to a first voltage by using logarithmic compression to convert a current generated by charges overflowing from the photoelectric conversion unit to the input node into a voltage corresponding to the current;
    transferring charges from the photoelectric conversion unit to the input node;
    setting a voltage of the input node to a second voltage by converting the charges transferred to the input node into a voltage corresponding to the charges;
    at the amplifier unit, outputting a first signal based on the first voltage and a second signal based on the second voltage;
    performing the logarithmic compression by using a diode having a first node connected to the input node and a second node supplied with a first power supply voltage that is different from a second power supply voltage to be supplied to the photoelectric conversion unit; and acquiring, as a reference signal for the first signal, an output of the amplifier unit when the input node is set to a third voltage defined in accordance with a threshold voltage of the diode.

2. The method of driving the solid-state imaging device according to claim 1 further comprising setting the input node to the third voltage by draining charges of the input node and turning off the diode after setting the input node to a fourth voltage used for setting the diode to an operational point that is higher than the threshold voltage.

3. The method of driving the solid-state imaging device according to claim 1 further comprising acquiring, as a reference signal for the second signal, an output of the amplifier unit when the input node is set to a predetermined reset voltage.

4. A method of driving a solid-state imaging device having a photoelectric conversion unit that generates charges by photoelectric conversion and an amplifier unit that comprises an input node, the method comprising:

setting a voltage of the input node to a first voltage by using logarithmic compression to convert a current generated by charges overflowing from the photoelectric conversion unit to the input node into a voltage corresponding to the current;

transferring charges from the photoelectric conversion unit to the input node;

setting a voltage of the input node to a second voltage by converting the charges transferred to the input node into a voltage corresponding to the charges;

at the amplifier unit, outputting a first signal based on the first voltage and a second signal based on the second voltage;

performing the logarithmic compression by using a MOS transistor connected to the input node, the MOS transistor including a source connected to the input node, a drain to which a predetermined voltage is supplied, and a gate to which a control signal that controls an operation is supplied;

acquiring, as a reference signal for the first signal, an output of the amplifier unit when the input node is set to a third voltage defined in accordance with a threshold voltage of the MOS transistor when the MOS transistor operates in a sub-threshold region; and setting the input node to the third voltage by, after setting the input node to a fourth voltage with the fourth voltage being supplied to the drain and the MOS transistor being turned on, switching a voltage supplied to the drain from the fourth voltage to a fifth voltage that is higher than the fourth voltage to drain charges of the input node with a control signal being supplied to the gate that causes the MOS transistor to operate in the sub-threshold region and turning off the MOS transistor.

5. A solid-state imaging device comprising: a photoelectric conversion unit that generates charges by photoelectric conversion; a transfer unit connected to the photoelectric conversion unit; an amplifier unit having an input node connected to the transfer unit; a logarithmic compression conversion unit connected to the input node; and a charge-to-voltage conversion unit connected to the input node, wherein when a current generated by charges overflowing from the photoelectric conversion unit to the input node with the transfer unit being not conductive is converted into a voltage corresponding to the current by logarithmic compression performed by the logarithmic compression conversion unit, a voltage of the input node is a first voltage, wherein when charges transferred from the photoelectric conversion unit to the input node in response to conduction of the transfer unit are converted into a voltage corresponding to the charges by the charge-to-voltage conversion unit, a voltage of the input node is a second voltage, wherein the amplifier unit outputs a first signal based on the first voltage and a second signal based on the second voltage, wherein the logarithmic compression conversion unit includes a diode having a first node connected to the input node and a second node supplied with a first power supply voltage that is different from a second power supply voltage to be supplied to the photoelectric conversion unit, and wherein the first voltage is a voltage corresponding to a voltage of the input node that changes due to the current flowing to the diode whose operational point is set in a sub-threshold region.

6. The solid-state imaging device according to claim 5, wherein the diode is a p-n junction diode.

7. The solid-state imaging device according to claim 5, wherein the diode is a MOS diode in which a gate and a drain of a MOS transistor are short-circuited.

8. The solid-state imaging device according to claim 5, wherein the logarithmic compression conversion unit further includes a switch provided between the diode and the input node.

9. The solid-state imaging device according to claim 5, wherein the logarithmic compression conversion unit includes a MOS transistor connected to the input node, and wherein the first voltage corresponds to a voltage of the input node that charges in response to the current flowing to the MOS transistor whose operational point is set in a sub-threshold region.

10. The solid-state imaging device according to claim 9, wherein the MOS transistor is a reset transistor configured to reset the input node.

11. The solid-state imaging device according to claim 5, wherein the charge-to-voltage conversion unit is a capacitance component coupled to the input node.

12. The solid-state imaging device according to claim 5 further comprising a signal processing unit that performs predetermined signal processing on each of the first signal and the second signal.

13. The solid-state imaging device according to claim 12, wherein the signal processing unit is configured to output the second signal when the second voltage does not exceed a predetermined value in accordance with a predetermined charge amount, and combine and outputs the first signal and the second signal when the second voltage exceeds the predetermined value.

14. An imaging system comprising:

the solid-state imaging device according to claim 5; and a signal processing unit that processes signals output from the solid-state imaging device.

15. The imaging system according to claim 14, wherein the signal processing unit is configured to output the second signal when the second voltage does not exceed a predetermined value in accordance with a predetermined charge amount, and combine and outputs the first signal and the second signal when the second signal exceeds the predetermined value.

16. A movable object comprising:
the solid-state imaging device according to claim 5;
a distance information acquisition unit that acquires distance information on a distance to an object, from a parallax image based on signals output from the solid-state imaging device; and
a control unit that controls the movable object based on the distance information.

17. A solid-state imaging device comprising:
a photoelectric conversion unit supplied with a first power supply voltage that generates charges by photoelectric conversion;
a transfer unit connected to the photoelectric conversion unit;
an amplifier unit having an input node connected to the transfer unit;
a diode having a first node connected to the input node and a second node supplied with a second power supply voltage different from the first power supply voltage; and
a charge-to-voltage conversion unit connected to the input node,
wherein when a current generated by charges overflowing from the photoelectric conversion unit to the input node with the transfer unit being not conductive is converted into a voltage corresponding to the current flowing via the diode, a voltage of the input node is a first voltage,
wherein when charges transferred from the photoelectric conversion unit to the input node in response to conduction of the transfer unit are converted into a voltage corresponding to the charges by the charge-to-voltage conversion unit, a voltage of the input node is a second voltage, and
wherein the amplifier unit outputs a first signal based on the first voltage and a second signal based on the second voltage.

18. The solid-state imaging device according to claim 17, wherein the first voltage is a voltage corresponding to a voltage of the input node that changes due to the current flowing to the diode whose operational point is set in a sub-threshold region.

19. An imaging system comprising:
the solid-state imaging device according to claim 17; and
a signal processing unit that processes signals output from the solid-state imaging device.

20. A movable object comprising:
the solid-state imaging device according to claim 17;
a distance information acquisition unit that acquires distance information on a distance to an object, from a parallax image based on signals output from the solid-state imaging device; and
a control unit that controls the movable object based on the distance information.

21. A solid-state imaging device comprising:
a photoelectric conversion unit supplied with a first power supply voltage that generates charges by photoelectric conversion;
a transfer unit connected to the photoelectric conversion unit;
an amplifier unit having an input node connected to the transfer unit;
a transistor having a first node connected to the input node and a second node supplied with a second power supply voltage different from the first power supply voltage; and
a charge-to-voltage conversion unit connected to the input node,
wherein when a current generated by charges overflowing from the photoelectric conversion unit to the input node with the transfer unit being not conductive is converted into a voltage corresponding to the current flowing via the transistor in a sub-threshold region, a voltage of the input node is a first voltage,
wherein when charges transferred from the photoelectric conversion unit to the input node in response to conduction of the transfer unit are converted into a voltage corresponding to the charges by the charge-to-voltage conversion unit, a voltage of the input node is a second voltage, and
wherein the amplifier unit outputs a first signal based on the first voltage and then outputs a second signal based on the second voltage.

22. The solid-state imaging device according to claim 21, wherein the transistor further performs a reset operation of the input node.

23. An imaging system comprising:
the solid-state imaging device according to claim 21; and
a signal processing unit that processes signals output from the solid-state imaging device.

24. A movable object comprising:
the solid-state imaging device according to claim 21;
a distance information acquisition unit that acquires distance information on a distance to an object, from a parallax image based on signals output from the solid-state imaging device; and
a control unit that controls the movable object based on the distance information.

* * * * *